US009793311B2

(12) United States Patent
Kimura

(10) Patent No.: US 9,793,311 B2
(45) Date of Patent: Oct. 17, 2017

(54) METHOD OF MANUFACTURING SEMICONDUCTOR UNIT AND THE SEMICONDUCTOR UNIT

(71) Applicant: Renesas Electronics Corporation, Koutou-ku, Tokyo (JP)

(72) Inventor: Masatoshi Kimura, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/201,485

(22) Filed: Jul. 3, 2016

(65) Prior Publication Data

US 2017/0077165 A1 Mar. 16, 2017

(30) Foreign Application Priority Data

Sep. 10, 2015 (JP) .................................. 2015-178533

(51) Int. Cl.
*H01L 21/00* (2006.01)
*H01L 27/146* (2006.01)

(52) U.S. Cl.
CPC .... *H01L 27/14643* (2013.01); *H01L 27/1461* (2013.01); *H01L 27/1463* (2013.01); *H01L 27/14607* (2013.01); *H01L 27/14627* (2013.01); *H01L 27/14689* (2013.01)

(58) Field of Classification Search
CPC ......... H01L 27/14643; H01L 27/14627; H01L 27/1461
See application file for complete search history.

(56) References Cited

U.S. PATENT DOCUMENTS

| 5,563,727 | A | * | 10/1996 | Larson | G02F 1/1362 345/90 |
| 6,387,744 | B2 | * | 5/2002 | Taniguchi | H01L 21/76229 257/E21.548 |
| 7,732,239 | B2 | * | 6/2010 | Kimura | H01L 27/14603 257/E21.133 |
| 9,237,281 | B2 | * | 1/2016 | Fukuda | H04N 5/35563 |
| 9,437,642 | B2 | * | 9/2016 | Kimura | H01L 27/14607 |
| 9,515,117 | B2 | * | 12/2016 | Kimura | H01L 27/14621 |
| 9,608,019 | B2 | * | 3/2017 | Lyu | H01L 27/14605 |
| 2004/0165097 | A1 | * | 8/2004 | Drowley | G06T 9/00 348/340 |
| 2007/0007559 | A1 | * | 1/2007 | Lee | H01L 27/14603 257/239 |

(Continued)

FOREIGN PATENT DOCUMENTS

JP 2004-228645 A 8/2004
JP 2013-093554 A 5/2013

*Primary Examiner* — Laura Menz
(74) *Attorney, Agent, or Firm* — Shapiro, Gabor and Rosenberger, PLLC

(57) ABSTRACT

In a solid-state imaging device including a plurality of pixels each pixel including a plurality of photodiodes, it is prevented that an incidence angle of incident light on the solid-state imaging device becomes large in a pixel in an end of the solid-state imaging device, causing a difference in output between the two photodiodes in the pixel, and thus autofocus detection accuracy is deteriorated. Photodiodes extending in a longitudinal direction of a pixel allay section are provided in each pixel. The photodiodes in the pixel are arranged in a direction orthogonal to the longitudinal direction of the pixel allay section.

5 Claims, 28 Drawing Sheets

(56) References Cited

U.S. PATENT DOCUMENTS

| | | | |
|---|---|---|---|
| 2012/0242634 A1* | 9/2012 | Maruyama | G06F 3/0412 345/207 |
| 2015/0179695 A1* | 6/2015 | Lyu | H01L 27/14643 257/292 |
| 2015/0357365 A1* | 12/2015 | Kimura | H01L 27/14607 257/225 |
| 2015/0357368 A1* | 12/2015 | Kimura | H01L 27/14621 257/292 |
| 2016/0020236 A1* | 1/2016 | Tanaka | H01L 27/14614 257/233 |
| 2016/0064447 A1* | 3/2016 | Kimura | H01L 27/14643 257/292 |
| 2016/0163897 A1* | 6/2016 | Sakai | H01L 31/03529 257/446 |
| 2016/0284759 A1* | 9/2016 | Kimura | H01L 27/14643 |
| 2016/0351614 A1* | 12/2016 | Kimura | H01L 27/14607 |
| 2017/0062500 A1* | 3/2017 | Kimura | H01L 27/14605 |
| 2017/0077153 A1* | 3/2017 | Kimura | H01L 27/14621 |
| 2017/0077165 A1* | 3/2017 | Kimura | H01L 27/14643 |
| 2017/0104910 A1* | 4/2017 | Kimura | H04N 5/2352 |
| 2017/0110501 A1* | 4/2017 | Hsu | H01L 27/14645 |
| 2017/0125466 A1* | 5/2017 | Kimura | H01L 27/14614 |

* cited by examiner

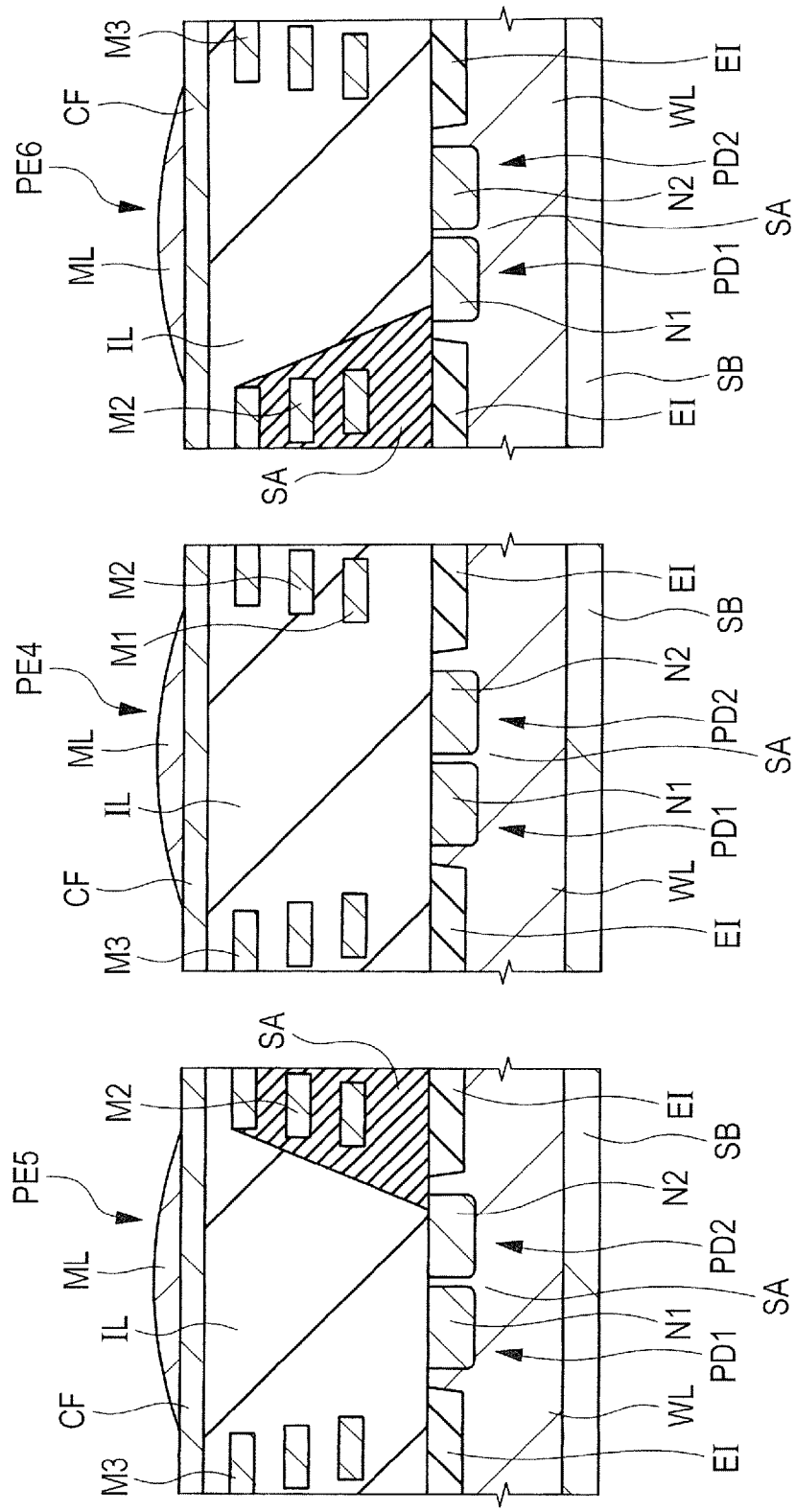

METHOD OF MANUFACTURING SEMICONDUCTOR UNIT AND THE SEMICONDUCTOR UNIT

CROSS-REFERENCE TO RELATED APPLICATIONS

The disclosure of Japanese Patent Application No. 2015-178533 filed on Sep. 10, 2015 including the specification, drawings and abstract is incorporated herein by reference in its entirety.

BACKGROUND

The present invention relates to a method of manufacturing a semiconductor unit and the semiconductor unit. Specifically, the invention relates to a semiconductor unit including a solid-state imaging device and a technique to be effectively applied to a method of manufacturing the semiconductor unit.

As well known, a solid-state imaging device (picture device) employing an image-plane phase-difference technique used in a digital camera having an autofocus system function includes a plurality of pixels each having at least two photodiodes.

Japanese Unexamined Patent Application Publication No. 2004-228645 describes a solid-state imaging device including pixels arranged with a small pitch, in which microlenses on the pixels are arranged with nonlinear pitches.

Japanese Unexamined Patent Application Publication No. 2013-93554 describes a solid-state imaging device including pixels with a small pitch and having two photodiodes for each pixel, in which a shape of a microlens on the pixel is varied.

SUMMARY

In the solid-state imaging device having at least two photodiodes for each pixel to be used for image-plane phase-difference autofocus, width of each photodiode must be equal to or smaller than half the width of a photodiode of a solid-state imaging device having one photodiode for each pixel. An incidence angle of incident light on the pixel of the solid-state imaging device from an exit pupil (camera lens) is large particularly on a pixel in an end in a longitudinal direction of the solid-state imaging device. In such a case, light to be incident on one of the two photodiodes in the pixel tends to be incorrectly incident on the other photodiode. This causes false detection between the two photodiodes, resulting in deterioration in autofocus detection accuracy.

Other objects and novel features will be clarified from the description of this specification and the accompanying drawings.

A typical one of some embodiments disclosed in this application is briefly summarized as follows.

According to one embodiment, there is provided a semiconductor unit including a solid-state imaging device, in which pixels are arranged in rows and columns in a pixel array section of the solid-state imaging device, each of the pixels includes two photodiodes extending in a longitudinal direction of the pixel array section, and the two photodiodes are arranged in a direction orthogonal to the longitudinal direction.

According to another embodiment, there is provided a semiconductor unit including a solid-state imaging device, in which pixels are arranged in rows and columns in a pixel array section of the solid-state imaging device, each of the pixels includes two photodiodes disposed therein and gate electrodes adjacent to the two respective photodiodes, and the gate electrodes are each disposed at a position closer to an end of the pixel array section than each of the photodiodes.

According to another embodiment, there is provided a method of manufacturing a semiconductor unit including a solid-state imaging device, in which pixels each including two photodiodes are arranged in rows and columns in a pixel array section of the solid-state imaging device, and in a pixel located closer to an end of the pixel array section than the center of the pixel array section, a semiconductor region having a second conductivity type, which isolates the two photodiodes in the pixel from each other, is provided closer to the end than the center of the semiconductor region having a first conductivity type configuring each photodiode.

According to the one embodiment disclosed in this application, performance of a semiconductor unit can be improved. In particular, focusing accuracy of an imaging device can be improved.

BRIEF DESCRIPTION OF THE DRAWINGS

FIG. 39 is a section view illustrating a semiconductor unit as a comparative example.

DETAILED DESCRIPTION

Hereinafter, some embodiments of the invention will be described in detail with reference to the accompanying drawings. In all drawings for explaining the following embodiments, components having the same function are designated by the same numeral, and duplicated description is omitted. In the following embodiments, an equivalent or similar portion is not repeatedly described except for a particularly required case.

Although the following description is given with a case where a well region of a pixel includes a p semiconductor region while a photodiode includes an n semiconductor region, similar effects are exhibited in a case where each of the well region and the photodiode has an opposite conductivity type. Although first to third embodiments below are described with an exemplary case where light is incident on a top side of a solid-state imaging device, when a similar structure or process flow is used, effects similar to those of the following embodiments can also be exhibited in a back-side-illumination (BSI) solid-state imaging device.

A sign "−" or "+" represents a relative concentration of an impurity having an n or p conductivity type. For example, the impurity concentration increases in order of "$n^{--}$", "$n$", and "$n^{+}$" for the n impurity. In this application, depth refers to a distance from a main surface toward a bottom of a semiconductor substrate.

First Embodiment

The semiconductor unit of the first embodiment relates to a solid-state imaging device, and particularly relates to a solid-state imaging device having a plurality of photodiodes in each pixel. The solid-state imaging device is a complementary metal oxide semiconductor (CMOS) image sensor having a function of outputting information necessary for autofocus by an image-plane phase-difference focus detection method. As described below, an isolating region is formed to prevent electrons from moving between two photodiodes adjacent to each other in a pixel, the electrons being caused by photoelectric conversion in a substrate under the photodiodes.

Structure and Function of Semiconductor Unit

Figure 1:
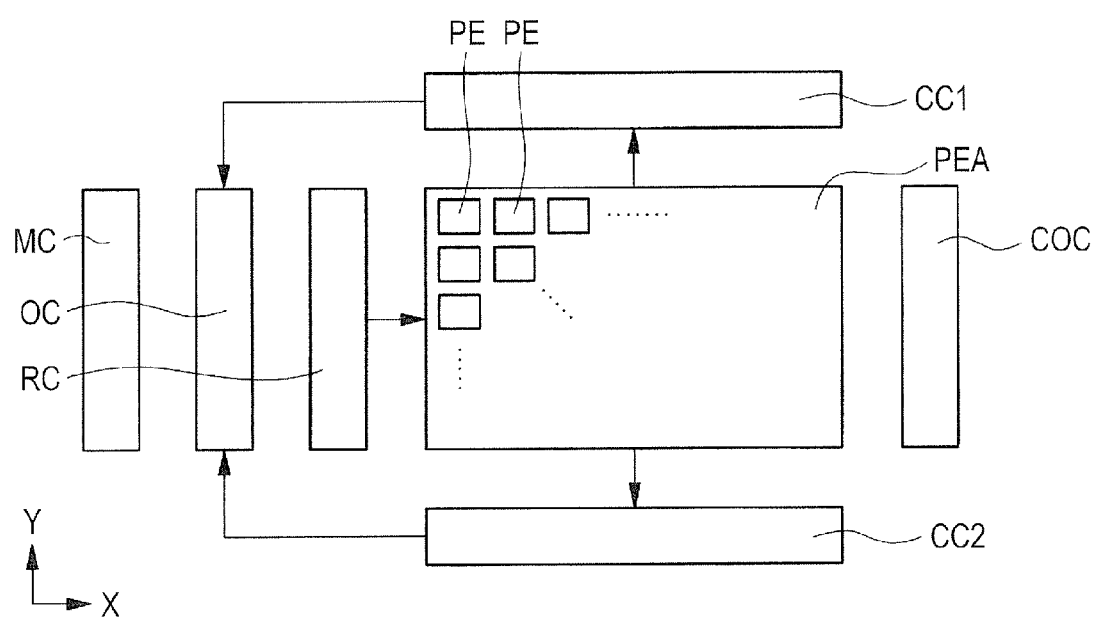
FIG. 1 is a schematic view illustrating a configuration of a semiconductor unit as a first embodiment of the invention.
Figure 2:
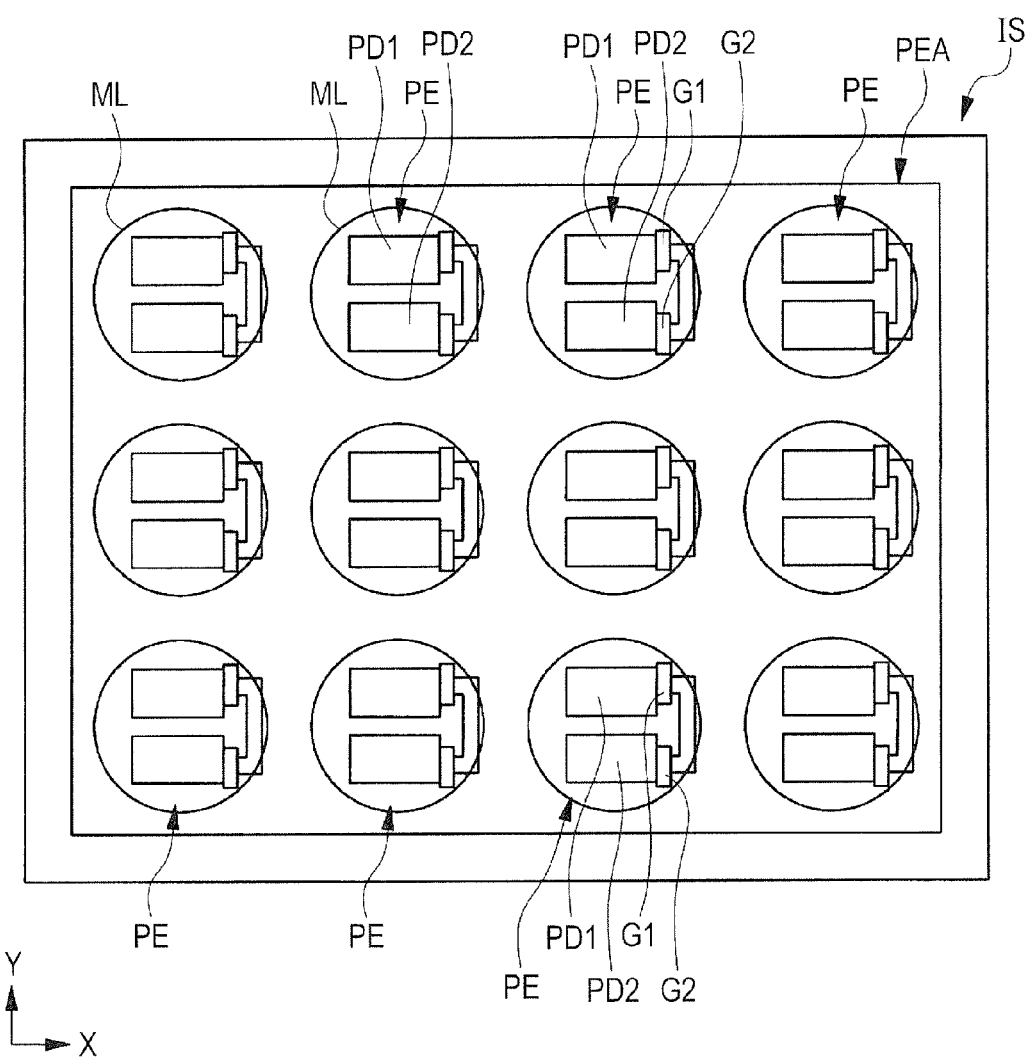
FIG. 2 is a plan view illustrating a solid-state imaging device of the semiconductor unit as the first embodiment of the invention.
Figure 3:
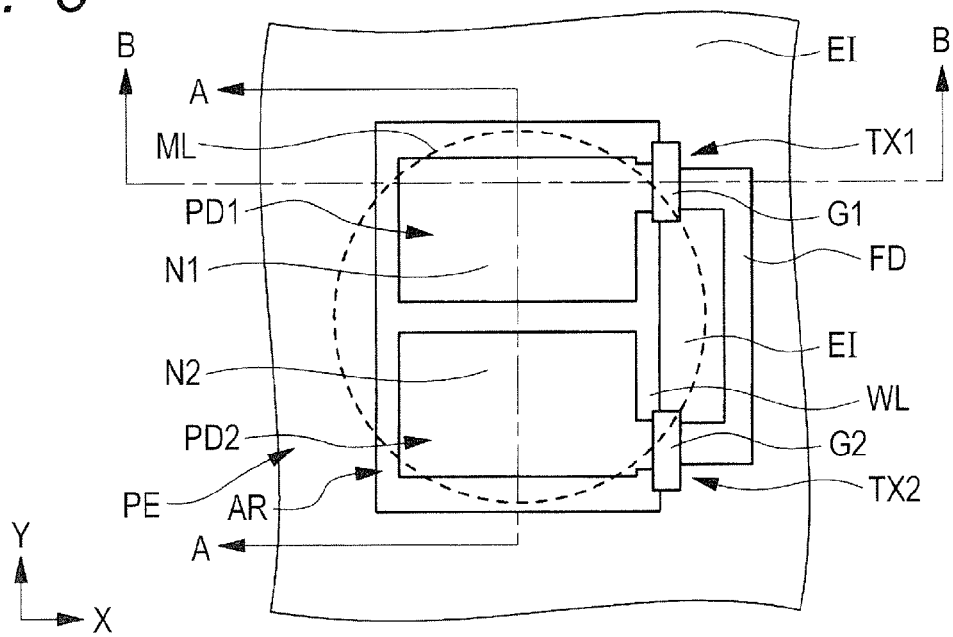
FIG. 3 is a plan view illustrating a pixel of the semiconductor unit as the first embodiment of the invention.
Figure 4:
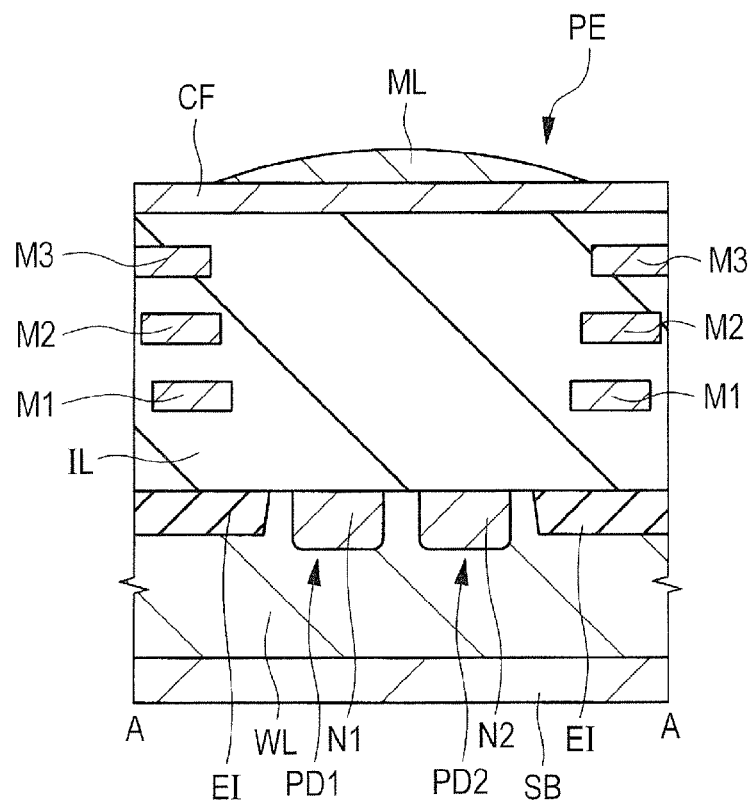
FIG. 4 is a section view along a line A-A in FIG. 3.
Figure 5:
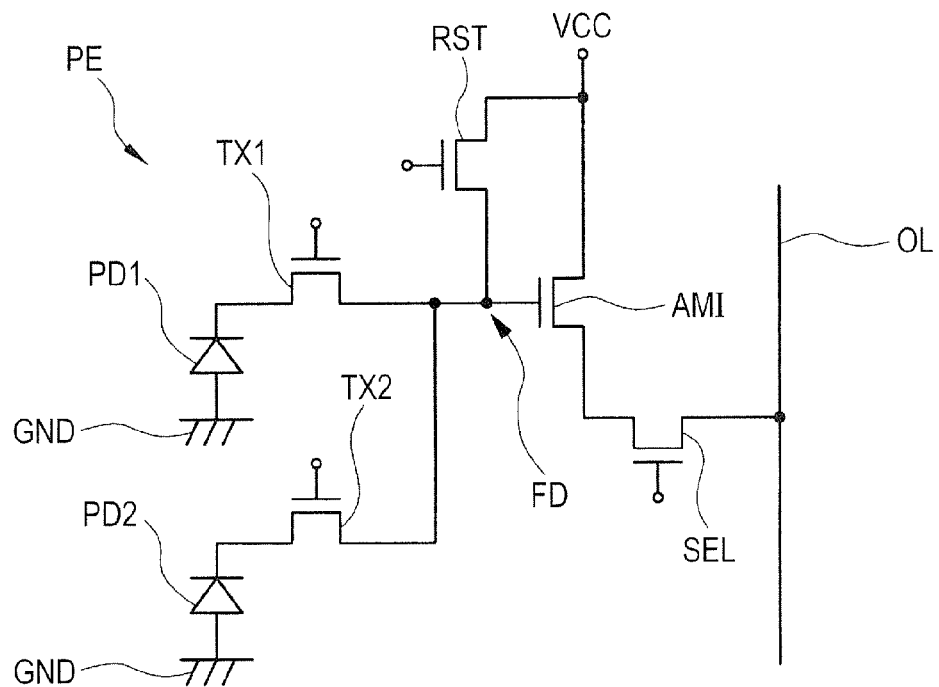
FIG. 5 is an equivalent circuit diagram illustrating the semiconductor unit as the first embodiment of the invention.

Hereinafter, a structure of the semiconductor unit of the first embodiment is described with FIGS. 1 to 4, and functions thereof are described with FIG. 5. FIG. 1 is a schematic view illustrating a configuration of the semiconductor unit as the first embodiment. FIG. 2 is a plan view illustrating a solid-state imaging device as the semiconductor unit of the first embodiment. FIG. 3 is a plan view illustrating one pixel of the solid-state imaging device as the semiconductor unit of the first embodiment in an enlarged manner. FIG. 4 is a section view along a line A-A in FIG. 3. FIG. 5 is an equivalent circuit diagram illustrating the semiconductor unit of the first embodiment.

Although the description is now given with a four-transistor pixel, which is used as a pixel realization circuit in a CMOS image sensor, as an exemplary pixel, this is not limitative. Specifically, each pixel has three transistors as peripheral transistors and a transfer transistor disposed around a light receiving region having two photodiodes. The peripheral transistors refer to a reset transistor, an amplifier transistor, and a selection transistor. In the plan view of FIG. 3, a pixel is shown while some of the transistors (peripheral transistors) are omitted, and the photodiodes, a floating diffusion capacitance section, and the transfer transistor are exclusively depicted for description.

The solid-state imaging device as the semiconductor unit of the first embodiment is a complementary metal oxide semiconductor (CMOS) image sensor, and includes a pixel array section (image area) PEA, read circuits CC1 and CC2, an output circuit OC, a row selection circuit RC, a control circuit COC, and a memory circuit MC as illustrated in FIG. 1.

The pixel allay section PEA has a plurality of pixels PE arranged in rows and columns. Specifically, the pixels PE are arranged in X- and Y-axis directions along a main surface of a semiconductor substrate configuring the solid-state imaging device on the top of the semiconductor substrate. The X-axis direction shown in FIG. 1 is a direction along the main surface of the semiconductor substrate configuring the solid-state imaging device and along a row direction in which the pixels PE are arranged in rows. The Y-axis direction is a direction along the main surface of the semiconductor substrate and orthogonal to the X-axis direction, and is a direction along a column direction in which the pixels PE are arranged in columns. That is, the pixels PE are arranged in a matrix.

Each of the pixels PE generates a signal having a level corresponding to intensity of received light. The row selection circuit RC selects a plurality of pixels PE in rows. Each of the pixels PE selected by the row selection circuit RC outputs the generated signal to an output line OL (see FIG. 5) as described later. The read circuits CC1 and CC2 are disposed to be opposed to each other in the Y-axis direction across the pixel allay section PEA. Each of the read circuits CC1 and CC2 reads the signal, which is output from each pixel PE to the output line OL, and sends the signal to the output circuit OC. The memory circuit MC is a storage section that temporarily stores the signal output from the output line OL.

The read circuit CC1 reads signals from half of the pixels PE close to the read circuit CC1, and the read circuit CC2 reads signals from the other half of the pixels PE close to the read circuit CC2. The output circuit OC receives the signals read from the pixels PE by the read circuits CC1 and CC2, and outputs the signals to the outside of the solid-state imaging device. The control circuit COC manages general operation of the solid-state imaging device as a whole, and controls operation of other components of the solid-state imaging device. The memory circuit MC stores a signal output from one of the two photodiodes in the pixel PE, and is thus used to measure magnitude of charge output from each of the two photodiodes.

FIG. 2 shows a simplified plan view of the solid-state imaging device IS of the first embodiment. The solid-state imaging device IS is a semiconductor chip, and has a rectangular shape long in one direction in plan view. That is, the solid-state imaging device IS has a rectangular shape extending in the X-axis direction in plan view. The pixel allay section PEA is provided in a central portion in plan view of the solid-state imaging device IS, and the pixels PE are disposed in rows and columns in the pixel allay section PEA. The circuits described with FIG. 1 are each disposed between the pixel allay section PEA and an end of the solid-state imaging device IS in plan view, for example. Specifically, the various circuits are disposed in corners of the solid-state imaging device IS, for example.

Although a small number of pixels PE arranged three in rows and four in columns are illustrated in FIG. 2 for better understanding of the drawing, a larger number of small pixels are actually arranged in the pixel allay section PEA.

The pixel allay section PEA has a rectangular shape in plan view and extends in the X-axis direction as with the shape of the solid-state imaging device IS. That is, the pixel allay section PEA has a rectangular shape long in one direction in plan view. In a camera having the solid-state imaging device IS, the center of the exit pupil (camera lens) is disposed directly above the center of the pixel allay section PEA in plan view with respect to the solid-state imaging device IS. The center of the pixel allay section PEA described herein corresponds to a position at which diagonals of the pixel allay section PEA having a rectangular shape in plan view intersect with each other. The center of the pixel allay section PEA can be identified with the center of the solid-state imaging device IS.

One microlens ML is provided directly above each pixel, and two photodiodes PD1 and PD2 in the pixel PE are provided so as to overlap with the microlens ML in plan view. That is, the microlens ML is provided directly above the photodiodes PD1 and PD2. In each pixel, a gate electrode G1 is provided at a position adjacent to the photodiode PD1, and a gate electrode G2 is provided at a position adjacent to the photodiode PD2 in plan view. As described later with FIG. 3, the gate electrodes G1 and G2 configure a gate electrodes of the transfer transistors.

In all the pixels PE, the gate electrodes G1 and G2 are located in one direction with respect to the photodiodes PD1 and PD2. Specifically, when the solid-state imaging device IS is a rectangular semiconductor chip having first, second, third, and fourth sides, the gate electrodes G1 and G2 are located close to the first side with respect to the photodiodes PD1 and PD2 in each pixel PE.

Each of the photodiodes PD1 and PD2 in each pixel PE has a rectangular shape in plan view, and extends in the X-axis direction. The photodiodes PD1 and PD2 in each pixel PE are disposed adjacent to each other in the Y-axis direction. The semiconductor unit of the first embodiment is largely characterized in that the longitudinal direction of the pixel allay section PEA is aligned with the longitudinal direction of each of the photodiodes PD1 and PD2 in each pixel, and the longitudinal direction of the pixel allay section PEA is orthogonal to a direction in which the photodiodes PD1 and PD2 are arranged in each pixel PE.

In other words, the solid-state imaging device IS, the pixel allay section PEA, and the photodiodes PD1 and PD2 extend in the same direction, and an undepicted parting line located between the photodiodes PD1 and PD2 in the pixel PE extends in the X-axis direction as with the pixel allay section PEA.

FIG. 3 shows one pixel PE, overlapping with one microlens ML in plan view, in the pixel allay section PEA (see FIGS. 1 and 2). That is, each pixel PE has one microlens ML. The contour of the microlens ML is shown by a broken line.

Area of one pixel PE is mostly occupied by a light receiving section including the photodiodes PD1 and PD2 provided in the top of a semiconductor substrate SB (see FIG. 4). A plurality of undepicted peripheral transistors are disposed around the light receiving section, and the periphery of an active region AR for the light receiving section and the peripheral transistors is surrounded by an element isolating region EI. The peripheral transistors described herein refer to a reset transistor RST, an amplifier transistor AMI, and a selection transistor SEL as shown in FIG. 5.

The active region AR of the light receiving section illustrated in FIG. 3 has a shape similar to a rectangle in plan view. The photodiodes PD1 and PD2 are arranged in the active region AR in the Y-axis direction along the main surface of the semiconductor substrate. The photodiodes PD1 and PD2 are provided separately from each other, and each have a rectangular shape in plan view. The longitudinal direction of each of the photodiodes PD1 and PD2 is along the X-axis direction. That is, both the photodiodes PD1 and PD2 extend in the X-axis direction.

A well region WL as a p⁻ semiconductor region lies between the photodiodes PD1 and PD2 adjacent to each other in the pixel PE, and partitions the photodiodes PD1 and PD2 from each other. As in a pixel described later with FIGS. 24 and 25, a semiconductor region having a higher p impurity concentration than the well region WL may lie between the photodiodes PD1 and PD2 to separate the photodiodes PD1 and PD2 from each other.

A floating diffusion capacitance section FD is a semiconductor region that serves as the drain region of each of the transfer transistor TX1 provided adjacent to the photodiode PD1 and the transfer transistor TX2 provided adjacent to the photodiode PD2, and is provided in the active region AR. Since the floating diffusion capacitance section FD is electrically floating, charge accumulated in the floating diffusion capacitance section FD is maintained while the reset transistor is not operated.

The drain region of each of the transfer transistors TX1 and TX2 is an $n^+$ semiconductor region provided in the main surface of the semiconductor substrate, and an undepicted contact plug is coupled to the top of the $n^+$ semiconductor region. An undepicted contact plug is also coupled to each of the tops of the gate electrodes G1 and G2.

The photodiode PD1 includes an n⁻ semiconductor region N1 and a well region WL as a p semiconductor region provided in the main surface of the semiconductor substrate. Similarly, the photodiode PD2 includes an n⁻ semiconductor region N2 and the well region WL provided in the main surface of the semiconductor substrate. In other words, the n⁻ semiconductor region N1 configures the cathode of the photodiode PD1, the n⁻ semiconductor region N2 configures the cathode of the photodiode PD2, and the well region WL configures the anode of each of the photodiodes PD1 and PD2. In addition, the n⁻ semiconductor region N1 configures the source region of the transfer transistor TX1, and the n⁻ semiconductor region N2 configures the source region of the transfer transistor TX2.

The photodiodes PD1 and PD2 as the light receiving elements can be considered to be provided in formation regions of the n⁻ semiconductor regions N1 and N2, respectively. In the active region AR, the p⁻ well region WL is provided around each of the regions having the n⁻ semiconductor regions N1 and N2.

The active region AR has a shape similar to a rectangle in plan view. One of the four sides of the rectangle has two protrusions coupled to each other at their extending ends. That is, the active region AR has a ring-like, planar layout including such protrusions and the rectangular pattern of the light receiving section. The element isolating region EI is provided inside the ring-like, planar layout. The respective drain regions of the transfer transistors TX1 and TX2 are provided in the protrusions. That is, the transfer transistors TX1 and TX2 share the floating diffusion capacitance section FD as the common drain region. The respective gate electrodes G1 and G2 are disposed so as to span the respective protrusions.

When a captured image is output, the signals (charge) from the two photodiodes in the pixel are combined and output in a form of one signal. This makes it possible to produce an image with image quality similar to that of an image by a solid-state imaging device including a plurality of pixels each having one photodiode.

Although a stacked interconnection layer including interconnections M1, M2, and M3 (see FIG. 4) is provided on the semiconductor substrate, each interconnection does not overlap with the light receiving section including the photodiodes PD1 and PD2 in plan view.

FIG. 4 shows a section view along a direction in which the photodiodes PD1 and PD2 are arranged in one pixel PE (see FIG. 3). The section view of FIG. 4 omits the boundaries between a plurality of interlayer insulating films stacked on the semiconductor substrate SB. The p⁻ well region WL is provided in the top of the semiconductor substrate SB including n single crystal silicon or the like. The element isolating region EI, which partitions an active region from another active region, is provided on the well region WL. The element isolating region EI includes, for example, a silicon oxide film, and fills a trench provided in the top of the semiconductor substrate SB. That is, the element isolating region EI is in contact with the surface of the semiconductor substrate.

The n⁻ semiconductor regions N1 and N2 are separately provided in the top of the well region WL. That is, in the semiconductor substrate SB, the well region WL is provided so as to cover each of the n⁻ semiconductor regions N1 and N2, and is in contact with each of the n⁻ semiconductor regions N1 and N2.

A portion of the well-region WL forming a pn junction with the n⁻ semiconductor region N1 functions as the anode of the photodiode PD1. A portion of the well region WL forming a pn junction with the n⁻ semiconductor region N2 functions as the anode of the photodiode PD2. The n⁻ semiconductor regions N1 and N2 are provided in one active region surrounded by the element isolating region EI. Each of the n⁻ semiconductor regions N1 and N2 has a depth deeper than the depth of the element isolating region EI.

In this way, the photodiode PD1 including the n⁻ semiconductor region N1 and the well region WL and the photodiode PD2 including the n⁻ semiconductor region N2 and the well region WL are provided in the active region provided in the pixel. The photodiodes PD1 and PD2 are arranged in the active region so as to sandwich a region in which the well region WL is exposed on the top of the semiconductor substrate SB.

An interlayer insulating film IL is provided on the semiconductor substrate SB so as to cover the element isolating region EI and the photodiodes PD1 and PD2. The interlayer insulating film IL is a stacked film including a plurality of insulating films. A plurality of interconnection layers are stacked in the interlayer insulating film IL, and an interconnection M1 covered with the interlayer insulating film IL is provided in the bottom interconnection layer. An interconnection M2 is provided above the interconnection M1 with the interlayer insulating film IL in between, and an interconnection M3 is provided above the interconnection M2 with the interlayer insulating film IL in between. A color filter CF is provided on the interlayer insulating film IL, and a microlens ML is provided on the color filter CF. During operation of the solid-state imaging device, light is applied to the photodiodes PD1 and PD2 through the microlens ML and the color filter CF.

No interconnection is provided directly above the active region having the photodiodes PD1 and PD2. This prevents light entering through the microlens ML from being shaded by an interconnection and thus being not applied to the photodiodes PD1 and PD2 as the light receiving section of the pixel. The interconnections M1 to M3 are each disposed in a region other than the active region, which prevents photoelectric conversion from occurring in the active region having the peripheral transistors and the like.

The first embodiment is described with the photodiode including the p well region as the anode and a diffusion layer being the n⁻ semiconductor region as the cathode. This however is not limitative, and similar effects can be exhibited by a solid-state imaging device having a photodiode including an n well and a p⁻ diffusion layer in the n well, or a photodiode including the N well and the p⁻ diffusion layer, each of which has thereon a diffusion layer having the same conductivity type as that of a pixel well.

A structure and operation of the solid-state imaging device are now described mainly with FIG. 5.

FIG. 5 shows an equivalent circuit of one pixel. Each of the pixels PE illustrated in FIG. 1 has a circuit illustrated in FIG. 5. As illustrated in FIG. 5, the pixel includes the photodiodes PD1 and PD2 performing photoelectric conversion, a transfer transistor TX1 that transfers charge generated in the photodiode PD1, and a transfer transistor TX2 that transfers charge generated in the photodiode PD2. The pixel further includes the floating diffusion capacitance section FD that accumulates the charge transferred from the transfer transistors TX1 and TX2, and the amplifier transistor AMI that amplifies an electric potential of the floating diffusion capacitance section FD. The pixel further includes the selection transistor SEL that selects whether the potential amplified by the amplifier transistor AMI is output to the output line OL coupled to one of the read circuits CC1 and CC2 (see FIG. 1), and the reset transistor RST that initializes the potential of each of the cathodes of the photodiodes PD1 and PD2 or the potential of the floating diffusion capacitance section FD to a predetermined potential. The transfer transistors TX1 and TX2, the reset transistor RST, the amplifier transistor AMI, and the selection transistor SEL are each an n-MOS transistor, for example.

Each of the anodes of the photodiodes PD1 and PD2 receives a ground potential GND as a negative-side power potential, and the cathodes of the photodiodes PD1 and PD2 are coupled to the sources of the transfer transistors TX1 and TX2, respectively. The floating diffusion capacitance section FD is coupled to each of the drains of the transfer transistors TX1 and TX2, the source of the reset transistor RST, and the gate of the amplifier transistor AMI. A positive-side power potential VCC is applied to the drain of the reset transistor RST and the drain of the amplifier transistor AMI. The source of the amplifier transistor AMI is coupled to the drain of the selection transistor SEL. The source of the selection transistor SEL is coupled to the output line OL coupled to one of the read circuits CC1 and CC2.

Pixel operation is now described. First, a predetermined potential is applied to the gate electrode of each of the transfer transistors TX1 and TX2 and the gate electrode of the reset transistor RST, so that any of such transistors is turned on. Consequently, charge remaining in each of the photodiodes PD1 and PD2 and charge accumulated in the floating diffusion capacitance section FD flow toward the positive-side power potential VCC, so that charge of each of the photodiodes PD1 and PD2 and charge of the floating diffusion capacitance section FD are initialized. Subsequently, the reset transistor RST is turned off.

Subsequently, incident light is applied to the pn junction of each of the photodiodes PD1 and PD2, causing photoelectric conversion in each photodiode. As a result, charge is generated in each of the photodiodes PD1 and PD2. Such two pieces of charge are transferred to the floating diffusion capacitance section FD by the transfer transistors TX1 and TX2. The floating diffusion capacitance section FD accumulates the transferred charge. Consequently, the potential of the floating diffusion capacitance section FD is varied.

Subsequently, the selection transistor SEL is turned on, and thus the varied potential of the floating diffusion capacitance section FD is amplified by the amplifier transistor AMI, and the amplified potential is output to the output line OL. One of the read circuits CC1 and CC2 reads the potential of the output line OL. When image-plane phase-difference autofocus is performed, charge of the photodiode PD1 and charge of the photodiode PD2 are not simultaneously transferred to the floating diffusion capacitance section FD by the transfer transistors TX1 and TX2, but the two pieces of charge are sequentially transferred and read, and thus the charge of each of the photodiodes PD1 and PD2 is read. For imaging, charge of the photodiode PD1 and charge of the photodiode PD2 are simultaneously transferred to the floating diffusion capacitance section FD.

Operation of the solid-state imaging device as the semiconductor unit of the first embodiment is now described more in detail. The operation of the solid-state imaging device includes imaging operation and autofocus operation.

First, pixel operation for imaging is described. A predetermined potential is applied to the gate electrode of each of the transfer transistors TX1 and TX2 and the gate electrode of the reset transistor RST to turn on those transistors. Charge remaining in each of the photodiodes PD1 and PD2 and charge accumulated in the floating diffusion capacitance section FD then flow toward the positive-side power potential VCC, so that charge of each of the photodiodes PD1 and PD2 and charge of the floating diffusion capacitance section FD are initialized. Subsequently, the reset transistor RST is turned off.

Subsequently, incident light is applied to the pn junction of each of the photodiodes PD1 and PD2, causing photoelectric conversion in each photodiode. As a result, charge L1 is generated in the photodiode PD1, and charge R1 is generated in the photodiode PD2. In this way, the photodiodes PD1 and PD2 are each a light receiving element that generates therein a signal charge corresponding to the light quantity of incident light through photoelectric conversion, i.e., are each a photoelectric conversion element.

Subsequently, the charge L1 and the charge R1 are transferred to the floating diffusion capacitance section FD. In imaging operation, the two photodiodes PD1 and PD2 in the pixel PE operate so as to function as one photoelectric conversion section; hence, charge of the photodiode PD1 and charge of the photodiode PD2 are combined and read as one signal. In other words, in the imaging operation, charge signals generated in the two photodiodes PD1 and PD2 are added and acquired as one pixel data.

Hence, the charge of the photodiode PD1 and the charge of the photodiode PD2 are not necessary to be separately read. In this operation, the transfer transistors TX1 and TX2 are turned on, thereby the two pieces of charge are transferred to the floating diffusion capacitance section FD. Consequently, the floating diffusion capacitance section FD accumulates the two pieces of charge transferred from the photodiodes PD1 and PD2. Consequently, the potential of the floating diffusion capacitance section FD is varied.

A process of such charge combination is now described in detail. First, while the charge L1 of the photodiode PD1 and the charge R1 of the photodiode PD2 are stored, a voltage is applied to each of the gate electrodes G1 and G2, so that the transfer transistors TX1 and TX2 are turned on. Consequently, the charge L1 and the charge R1 are transferred to the floating diffusion capacitance section FD and combined therein.

Subsequently, the selection transistor SEL is turned on, and the varied potential of the floating diffusion capacitance section FD is amplified by the amplifier transistor AMI, and thus an electric signal corresponding to the variation in potential of the floating diffusion capacitance section FD is output to the output line OL. Specifically, an electric signal output by the amplifier transistor AMI is output to the outside through operation of the selection transistor SEL. Consequently, one of the read circuits CC1 and CC2 (see FIG. 1) reads the potential of the output line OL.

Pixel operation for image-plane phase-difference autofocus is now described. The solid-state imaging device as the semiconductor unit of the first embodiment includes pixels each having a plurality of photoelectric conversion sections (for example, photodiodes) therein. In this way, a plurality of photodiodes are provided in one pixel. This is because when such a solid-state imaging device is used in, for example, a digital camera having an image-plane phase-difference autofocus detection system, accuracy and speed of autofocus can be improved.

Such a digital camera calculates a moving distance of a focus lens necessary for focusing based on the amount of shift between signals detected by the two photodiodes in the pixel, i.e., based on a phase difference, and thus achieves rapid focusing. A plurality of photodiodes provided in a pixel therefore allows a larger number of small photodiodes to be provided in the solid-state imaging device, leading to improvement in accuracy of autofocus. Hence, unlike the imaging operation, a plurality of pieces of charge generated in the photodiodes in the pixel must be separately read for autofocus operation.

In the autofocus detection operation, first, a predetermined potential is applied to the gate electrode of each of the transfer transistors TX1 and TX2 and the gate electrode of the reset transistor RST, so that those transistors are turned on. Consequently, charge of each of the photodiodes PD1 and PD2 and charge of the floating diffusion capacitance section FD are initialized. Subsequently, the reset transistor RST is turned off.

Subsequently, incident light is applied to the pn junction of each of the photodiodes PD1 and PD2, causing photoelectric conversion in each photodiode. As a result, charge is generated in each of the photodiodes PD1 and PD2.

Subsequently, one of the charge of the photodiode PD1 and the charge of the photodiode PD2 is transferred to the floating diffusion capacitance section FD. The transfer transistor TX1 is first turned on, thereby the charge L1 of the photodiode PD1 is read into the floating diffusion capacitance section FD, so that a potential of the floating diffusion capacitance section FD is varied. Subsequently, the selection transistor SEL is turned on, and thus the varied potential of the floating diffusion capacitance section FD is amplified by the amplifier transistor AMI, and then the amplified potential is output to the output line OL. That is, an electric signal corresponding to a variation in potential of the floating diffusion capacitance section FD as a charge detection section is amplified by the amplifier transistor AMI and then output. One of the read circuits CC1 and CC2 (see FIG. 1) reads the potential of the output line OL. A signal including the charge L1 is thus read, and is stored in the memory circuit MC (see FIG. 1).

At this time, the charge L1 generated in the photodiode PD1 still remains in the floating diffusion capacitance section FD, and thus the floating diffusion capacitance section FD still has the varied potential. In addition, the charge R1 of the photodiode PD2 is not transferred yet.

Subsequently, the transfer transistor TX2 is turned on, thereby the charge R1 of the photodiode PD2 is read into the floating diffusion capacitance section FD, so that the potential of the floating diffusion capacitance section FD is further varied.

Consequently, the floating diffusion capacitance section FD accumulates the combined charge of the previously accumulated charge L1 of the photodiode PD1 and the charge R1 of the photodiode PD2 transferred thereafter. That is, the charge L1+R1 is accumulated in the floating diffusion capacitance section FD.

Subsequently, the selection transistor SEL is turned on, and thus the varied potential of the floating diffusion capacitance section FD is amplified by the amplifier transistor AMI, and then the amplified potential is output to the output line OL. One of the read circuits CC1 and CC2 (see FIG. 1) reads the potential of the output line OL. Charge L1+R1 is thus read, and the following calculation is performed to calculate the charge R1 generated in the photodiode PD2 from the charge L1+R1. Specifically, the value of the charge L1 stored in the memory circuit MC (see FIG. 1) is subtracted from the value of the charge L1+R1. Consequently, the charge R1 of the photodiode PD2 can be read. Such calculation is performed by, for example, the control circuit COC (see FIG. 1).

Subsequently, a moving distance of the focus lens necessary for focusing is calculated based on the amount of shift between the charge L1 and the charge R1 detected by the photodiodes PD1 and PD2 in each pixel PE of the pixel allay section PEA (see FIG. 1), i.e., based on a phase difference, and automatic focal-point detection is performed.

When the charge of the photodiode PD1 and the charge of the photodiode PD2 are in turn read as described above, the charge R1 of the photodiode PD2 may be first read before reading of the charge L1 of the photodiode PD1.

In a possible method as another autofocus operation, calculation of the charge R1 from the combined charge L1+R1 is omitted. Specifically, the transfer transistor TX1 is first turned on so that the charge L1 is read and stored, and then the reset transistor RST is turned on to reset the floating diffusion capacitance section FD. Subsequently, the transfer transistor TX2 is turned on, thereby the charge R1 of the photodiode PD2 can be singly read. In this case, although the charge L1 must also be stored in the memory circuit MC (see FIG. 1), the charge L1 and the charge R1 can be individually read without the calculation as described above.

When the solid-state imaging device of the first embodiment is used in a digital camera, the above-described imaging operation is performed for each pixel for both still imaging and video imaging. In video imaging, the autofocus operation is performed for each pixel together with imaging. To take a high-quality moving image, it is important to achieve fast and accurate autofocus detection.

Figure 37:
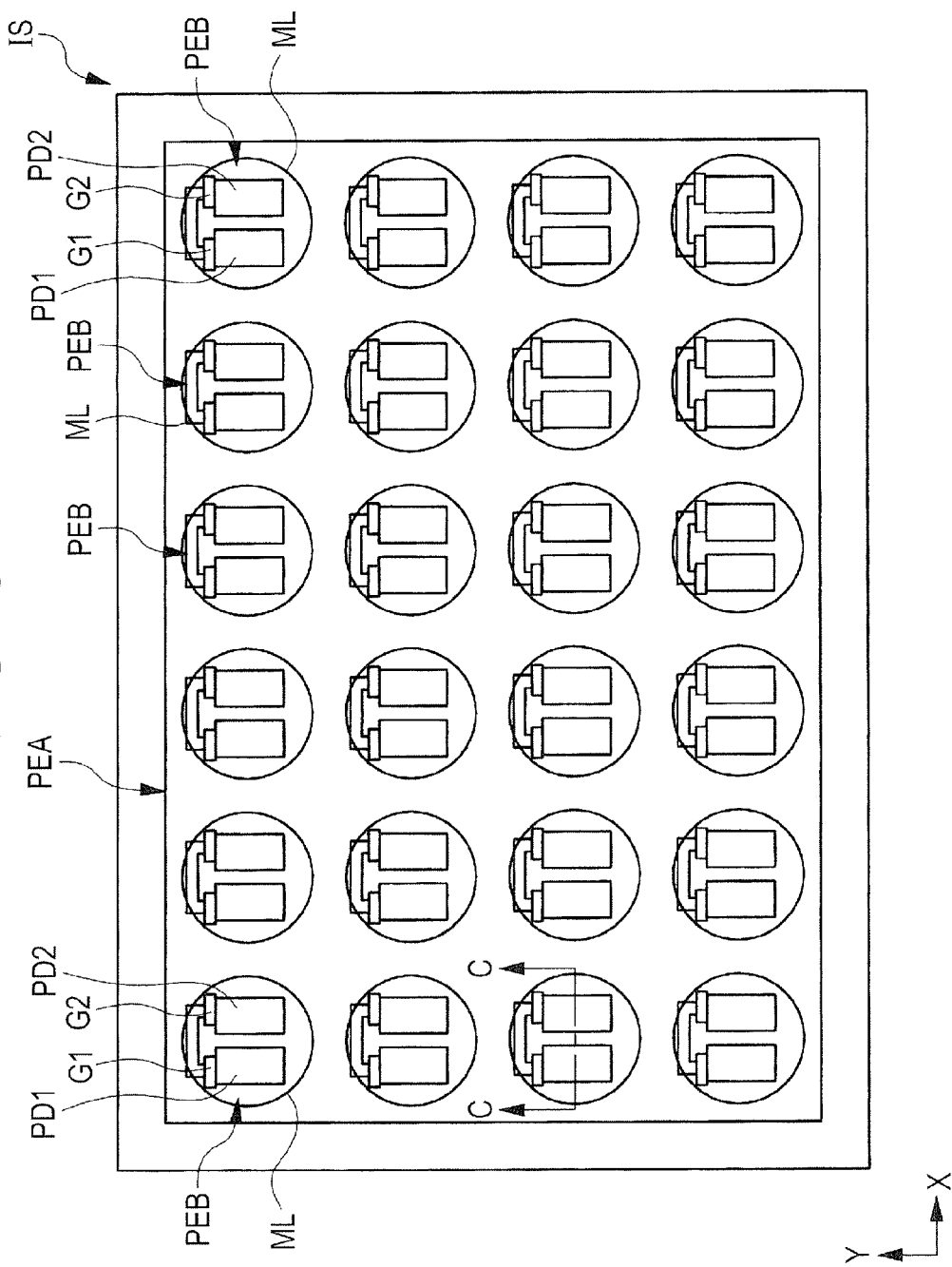
FIG. 37 is a plan view illustrating a semiconductor unit as a comparative example.
Figure 38:
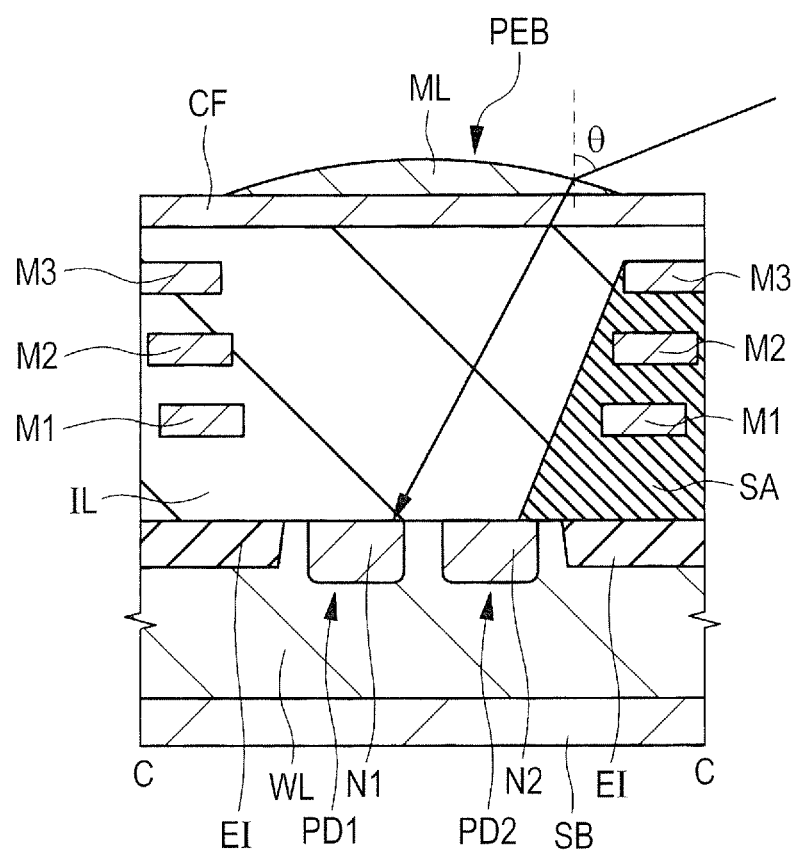
FIG. 38 is a section view along a line C-C in FIG. 37.

Effects of the semiconductor unit of the first embodiment are now described with reference to a comparative example illustrated in FIGS. 37 and 38. FIG. 37 is a plan view illustrating a solid-state imaging device as a comparative example. FIG. 38 is a section view along a line C-C in FIG. 37.

In the solid-state imaging device IS illustrated in FIG. 37, the longitudinal direction of each of the photodiodes PD1 and PD2 of each pixel PEB is orthogonal to the longitudinal direction of the solid-state imaging device IS or the pixel allay section PEA. The longitudinal direction of each of the photodiodes PD1 and PD2 is thus not aligned with the longitudinal direction of the solid-state imaging device IS or the pixel allay section PEA, except which the structure of the solid-state imaging device IS illustrated in FIG. 37 is the same as that of the solid-state imaging device of the first embodiment as described with FIG. 2.

An incidence angle θ (see FIG. 38) of light is large at an end of the pixel array section (image area) of the solid-state imaging device because of a large distance from the center of the pixel array section to the end. Hence, sensitivity of a pixel is disadvantageously reduced due to eclipse of the incident light by an interconnection, light incidence on an adjacent pixel, or leakage of a photoelectron. In addition, when the solid-state imaging device having two photodiodes for each pixel is used as one method for achieving the image-plane phase-difference autofocus (AF) technique to speed up AF detection, the following problem occurs.

Specifically, when one pixel has two photodiodes, width of each of the plurally divided photodiodes in the pixel is equal to or smaller than half the width of a photodiode that is singly provided in a pixel. For example, when an interval (pixel pitch) between pixels is reduced, probability of light incidence on a predetermined photodiode between the two photodiodes in the pixel is decreased at the end of the image area by eclipse by an interconnection or reflection on an adjacent photodiode due to the large incidence angle θ of obliquely incident light. This disadvantageously increases detection error in phase-difference AF.

In this application, eclipse means that light to be incident on a light receiving region of a pixel is blocked by an interconnection. The decrease in probability of light incidence on a photodiode due to eclipse is particularly problematic in the case of reduced pixel size. This is because a reduction in size of a photodiode increases an area ratio of a region where the photodiode overlaps with a shading region (shadow region) to the photodiode in a pixel.

FIG. 38 shows light by a solid-line arrow, the light being incident at an incidence angle θ on a pixel PEB in the end of the image area. FIG. 38 further shows a region in which a shadow is created because light incident from the upper right of the drawing is blocked by the interconnection M3, i.e., shows a shading region (shadow region) SA that is not irradiated with light.

In the pixel PEB in the end of the image area, incident light has a large incidence angle θ and is blocked by the interconnection M3 or the like, thereby one photodiode PD2 of the two photodiodes PD1 and PD2 in the pixel PEB partially overlaps with the shading region SA. Hence, the photodiode PD2 has a smaller number of electrons generated through photoelectric conversion than the photodiode PD1, and thus balance of an output signal between the two photodiodes is degraded. Such a degradation in balance of an output signal between the two photodiodes PD1 and PD2 in the pixel PEB leads to error in image-plane phase-difference detection, causing a reduction in accuracy in autofocus detection or an increase in detection time.

The shading region SA of the pixel PEB becomes larger as it is more distant from the center of the pixel allay section PEA as shown in FIG. 37. Hence, when the pixel allay section PEA has a rectangular shape in plan view, such a problem is more significant for a pixel PEB in an end in the longitudinal direction of the pixel allay section PEA than for a pixel PEB in an end in the lateral direction of the pixel allay section PEA. When pixel size is reduced, such a problem becomes more significant because width of the photodiode, a space between the photodiodes, and a pixel pitch each become small.

In the comparative example as shown in FIGS. 37 and 38, the pixel PEB is located in an end in the longitudinal direction (X-axis direction) of the pixel allay section PEA, in which the photodiodes PD1 and PD2 extending in the lateral direction (Y-axis direction) of the pixel allay section PEA are arranged in the longitudinal direction (X-axis direction) of the pixel allay section PEA. Hence, when light is applied from the exit pupil directly above the center of the pixel allay section PEA to the solid-state imaging device IS, the light is incident on the photodiodes PD1 and PD2 in the pixel PEB in the end in the longitudinal direction (X-axis direction) of the pixel allay section PEA along a direction in which such photodiodes PD1 and PD2 are arranged in plan view.

In that pixel PEB, therefore, a large shading region SA overlaps with only the photodiode PD2, which clearly causes difficulties such as a reduction in accuracy in autofocus detection and an increase in detection time in a solid-state imaging device IS used for image-plane phase-difference detection. Such difficulties are particularly serious in the pixel PEB in the end in the longitudinal direction (X-axis direction) of the pixel allay section PEA, in which the incidence angle θ is particularly large because the photodiodes PD1 and PD2 are arranged along the direction in which the incident light comes in plan view.

In the solid-state imaging device of the first embodiment, therefore, as illustrated in FIG. 2, the photodiode PD1 extending in the X-axis direction and the photodiode PD2 extending in the X-axis direction are arranged in the Y-axis direction orthogonal to the longitudinal direction (X-axis direction) of the pixel allay section PEA in each of the pixels PE arranged in rows and columns in the pixel allay section PEA. Hence, when light is applied from the exit pupil directly above the center of the pixel allay section PEA to the solid-state imaging device IS, the light is incident on the pixel PEB, which is located in the end in the longitudinal direction (X-axis direction) of the pixel allay section PEA, in the X-axis direction orthogonal to the Y-axis direction, in which the photodiodes PD1 and PD2 are arranged, in plan view.

Figure 6:
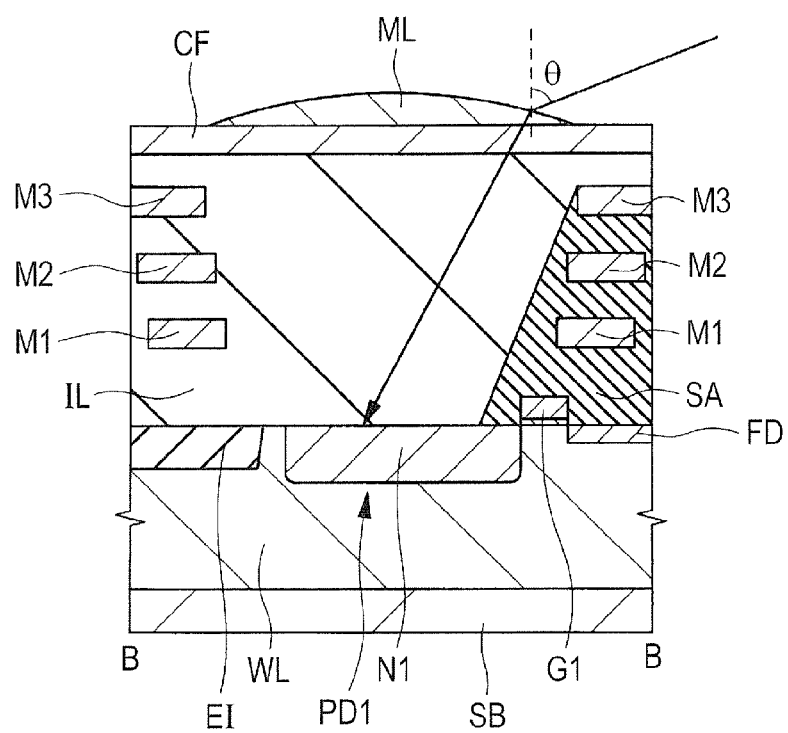
FIG. 6 is a section view along a line B-B in FIG. 3.

FIG. 6 shows a section view along a line B-B in FIG. 3. FIG. 6 illustrates a pixel PE in an end in the longitudinal direction of the pixel allay section PEA (see FIG. 2), and illustrates light incident on that pixel PE by a solid-line arrow. As illustrated in FIG. 6, since incident light is blocked by the interconnection M3, the shading region SA is formed as in the comparative example as shown in FIG. 38. However, the photodiode PD1 and the photodiode PD2 (see FIG. 3) extend in the X-axis direction as a direction in which incident light comes in plan view while being arranged in the direction orthogonal to the longitudinal direction of the pixel allay section PEA. Hence, the pixel PE in the end in the longitudinal direction of the pixel allay section PEA is less affected by light leakage between the two photodiodes due to eclipse or reflection of light by the interconnection M3.

Specifically, the two photodiodes PD1 and PD2 overlap with the shading region SA in the same way in the pixel PE in the end in the longitudinal direction of the pixel allay section PEA. It is therefore possible to prevent a difference in output between the photodiodes PD1 and PD2 in the pixel PE. This results in good property balance between the photodiodes PD1 and PD2, making it possible to minimize detection error in image-plane phase-difference AF. That is, a focusing state can be determined accurately and rapidly in image-plane phase-difference autofocus operation.

Hence, since accuracy and speed of autofocus can be improved in the solid-state imaging device IS (see FIG. 2) used in the image-plane phase-difference autofocus operation, performance of the semiconductor unit can be improved.

Figure 7:
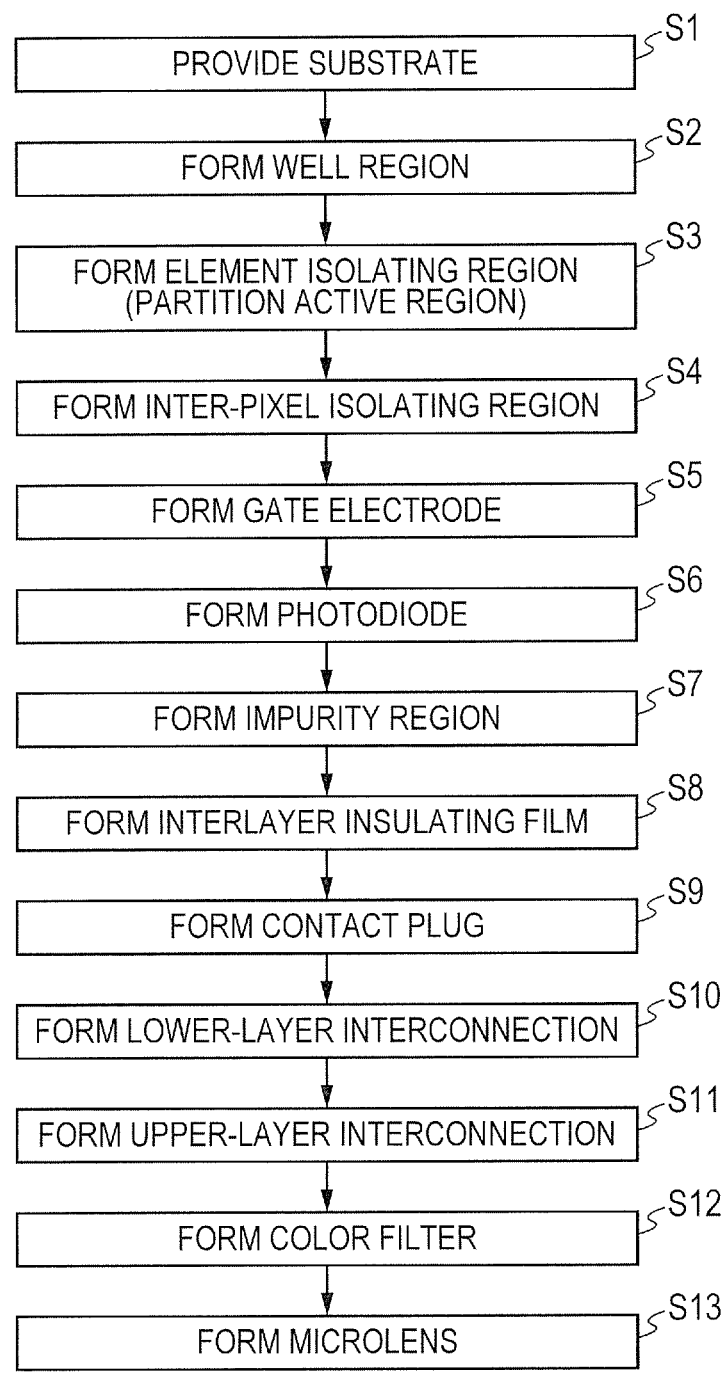
FIG. 7 is a diagram illustrating a procedure of a manufacturing process of the semiconductor unit as the first embodiment of the invention.

A method of manufacturing the semiconductor unit of the first embodiment is now described with FIGS. 7 to 21. FIG. 7 is a diagram illustrating a procedure of a manufacturing process of the semiconductor unit of the first embodiment. FIGS. 8, 10, 12, 14, 17, 19, and 21 are each a section view for explaining the manufacturing process of the semiconductor unit of the first embodiment. FIGS. 9, 11, 13, 15, 16, 18, and 20 are each a plan view for explaining the manufacturing process of the semiconductor unit of the first embodiment.

Although the method is now described with a four-transistor pixel, which is used as a pixel realization circuit in a CMOS image sensor, as an exemplary pixel, this is not limitative. The method is described below with a plan view, in which only the photodiodes and the floating diffusion capacitance section in such a pixel are depicted while some of the transistors and the like are omitted.

FIGS. 10, 12, 14, 17, 19, and 21 are views illustrating sections along lines A-A in FIGS. 9, 11, 13, 16, 18, and 20, respectively. Each plan view used in the following description does not show the interlayer insulating film and some of interconnections, such as an interconnection coupled to the transfer transistor, for example.

Figure 8:
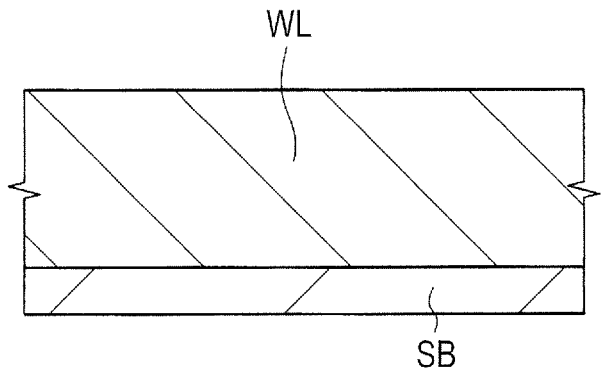
FIG. 8 is a section view for explaining the manufacturing process of the semiconductor unit as the first embodiment of the invention.

First, as illustrated in FIG. 8, the semiconductor substrate SB is provided (step S1 of FIG. 7). Subsequently, the well region WL is formed in the top of the semiconductor substrate SB (step S2 of FIG. 7). The semiconductor substrate SB includes single-crystal silicon (Si), for example. The well region WL is formed by introducing a p impurity (for example, boron (B)) into the main surface of the semiconductor substrate SB by an ion implantation process or the like. The well region WL is a p⁻ semiconductor region having a relatively low impurity concentration.

Figure 9:
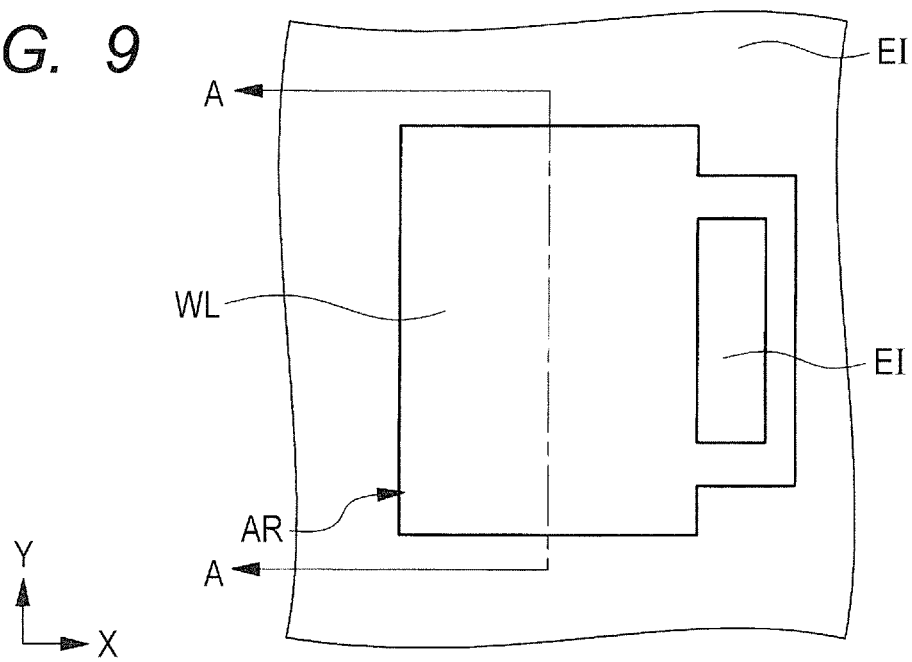
FIG. 9 is a plan view for explaining the manufacturing process of the semiconductor unit following FIG. 8.
Figure 10:
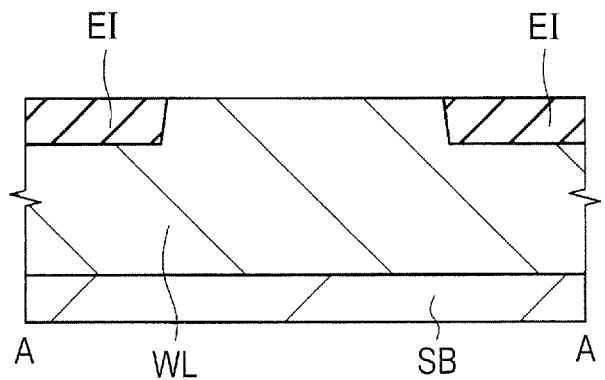
FIG. 10 is a section view for explaining the manufacturing process of the semiconductor unit following FIG. 8.

Subsequently, as illustrated in FIGS. 9 and 10, a trench is formed in the main surface of the semiconductor substrate SB, and the element isolating region EI is formed in the trench (step S3 of FIG. 7). Consequently, a region in which the top of the semiconductor substrate SB is exposed from the element isolating region EI, i.e., the active region is defined (partitioned). The element isolating region EI can be formed by, for example, a shallow trench isolation (STI) process or a local oxidization of silicon (LOCOS) process. In this case, the element isolating region EI is formed by the STI process. The well region WL is provided in the entire top of the semiconductor substrate in the active region AR.

Although the method is described with the case where the well region WL is formed before the active region AR is defined, the element isolating region EI may be conversely formed before the well region WL is formed. In such a case, the well region WL is formed by implanting the p impurity with an acceleration energy allowing penetration through the active region AR and the element isolating region EI.

As illustrated in FIG. 9, the active region AR surrounded by the element isolating region EI has a region in which the light receiving section including the two photodiodes is formed in a later step, and a region in which the floating diffusion capacitance section is to be formed, the floating diffusion capacitance section serving as the drain region of the transfer transistor and as a charge-accumulating region. The region, in which the light receiving section is to be formed, has a rectangular shape in plan view, and two ends of the region, in which the floating diffusion capacitance section is to be formed, are in contact with one of the four sides of the region in which the light receiving section is to be formed. Specifically, the active region AR has a ring-like structure including such two regions, and the element isolating region EI is provided in a portion surrounded by the two regions.

In other words, the region, in which the floating diffusion capacitance section is to be formed, has a shape including two patterns that protrude toward the element isolating region EI from two places in the one side in the region in which the light receiving section is to be formed, and are coupled to each other at one place. The two protruding patterns as the region, in which the floating diffusion capacitance section is to be formed, may not be coupled to each other. In such a case, the active region AR does not have a ring-like structure. As illustrated in FIG. 10, the element isolating region EI is formed with a depth smaller than the depth of the bottom of the well region WL.

Subsequently, while not shown, impurity implantation is performed to isolate the photodiodes to be formed later from one another, i.e., inter-pixel isolating implantation is performed (step S4 of FIG. 7). Specifically, a p impurity (for example, boron (B)) is implanted into a region, which is the top of the semiconductor substrate SB and surrounds the region in which each photodiode is formed, by an ion implantation process or the like, thereby an undepicted pixel isolating region as a p⁺ semiconductor region is formed in the top of the semiconductor substrate. The ion implantation for forming the pixel isolating region is performed through multistage implantation including several times, for example, about five to seven times, of ion implantation steps.

The inter-pixel isolating implantation leads to formation of a potential barrier to electrons between pixels to be formed later. This prevents electrons from diffusing to adjacent pixels, making it possible to improve sensitivity characteristics of an imaging device.

Figure 11:
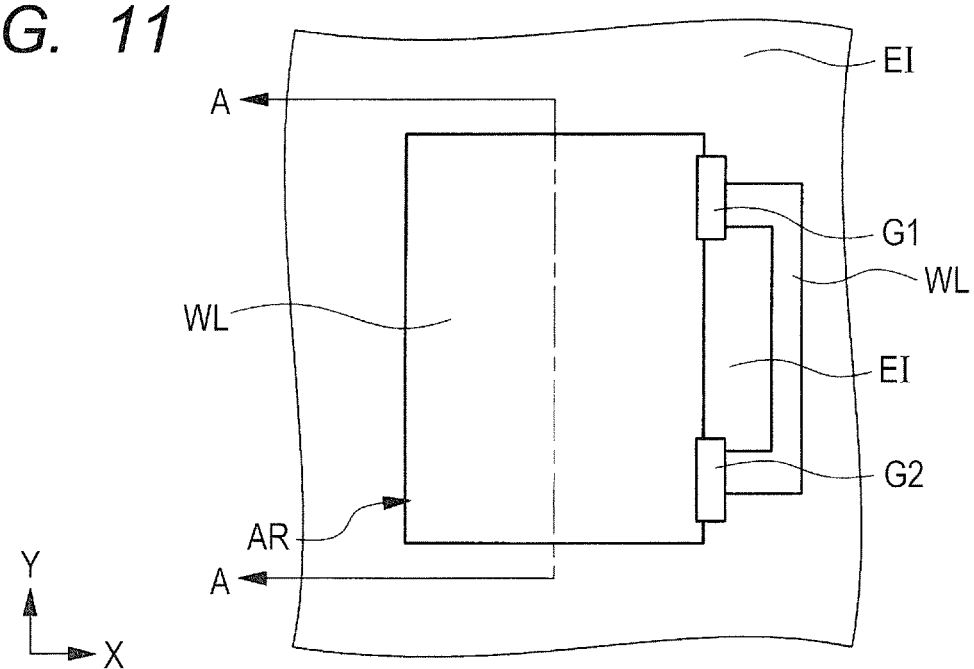
FIG. 11 is a plan view for explaining the manufacturing process of the semiconductor unit following FIG. 9.
Figure 12:
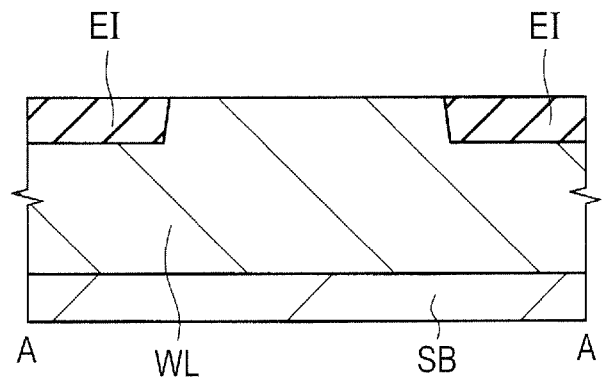
FIG. 12 is a section view for explaining the manufacturing process of the semiconductor unit following FIG. 9.

Subsequently, as illustrated in FIGS. 11 and 12, gate electrodes are formed on the semiconductor substrate SB with a gate insulating film in between (step S5 of FIG. 7). Thus, the gate electrodes G1 and G2 are formed with an undepicted gate insulating film in between on a boundary between the region, in which the light receiving section is to be formed, and the region, in which the floating diffusion capacitance section is formed, in the active region AR. Specifically, the gate electrode G1 is formed directly above one of the patterns of the active region AR protruding from the two places of the one side of the region in which the light receiving section is to be formed, and the gate electrode G2 is formed directly above the other of the patterns. Each of the gate electrodes G1 and G2 configures the gate electrode of the transfer transistor to be formed later. Gate electrodes of peripheral transistors to be formed later are also formed in an undepicted region.

Figure 13:
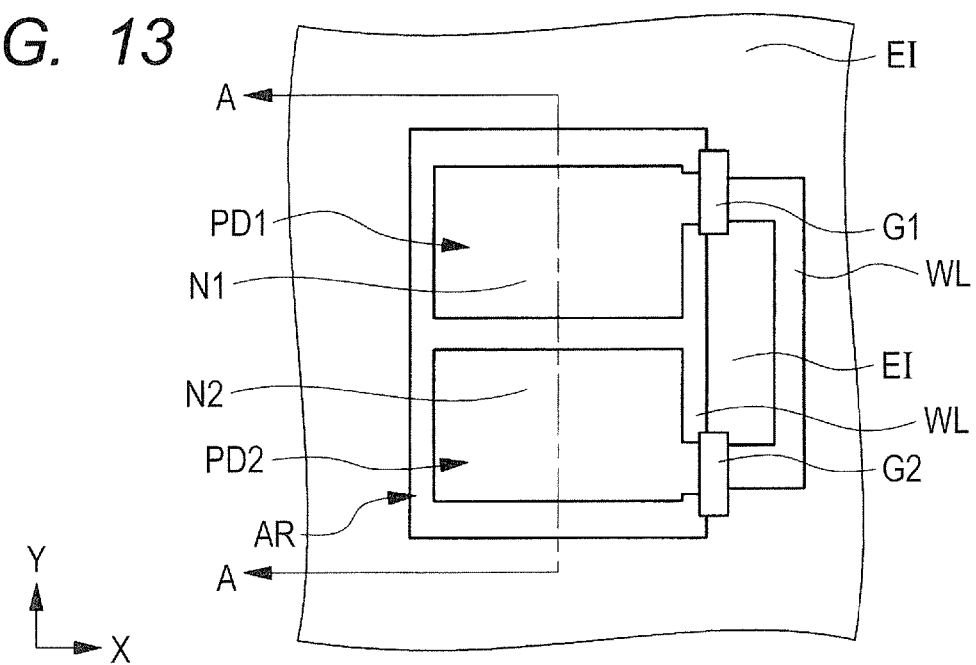
FIG. 13 is a plan view for explaining the manufacturing process of the semiconductor unit following FIG. 11.
Figure 14:
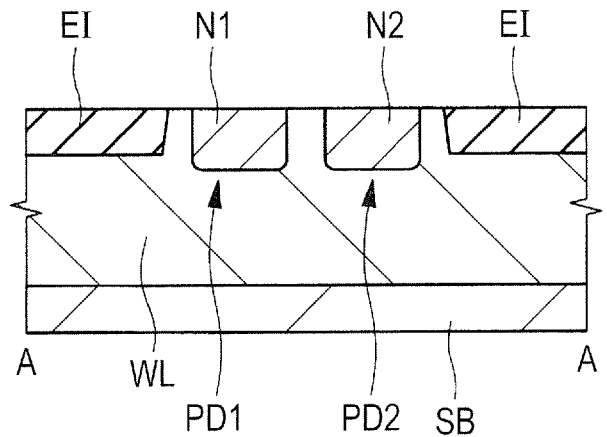
FIG. 14 is a section view for explaining the manufacturing process of the semiconductor unit following FIG. 11.

Subsequently, as illustrated in FIGS. 13 and 14, the photodiode PD1 including the n⁻ semiconductor region N1 and the photodiode PD2 including the n⁻ semiconductor region N2 are formed in the top of the semiconductor substrate SB (step S6 of FIG. 7). Specifically, an n impurity (for example, arsenic (As) or phosphorous (P)) is implanted into the main surface of the semiconductor substrate SB by, for example, anion implantation process, thereby the n⁻ semiconductor regions N1 and N2 are formed in the region in which the light receiving section is to be formed in the active region AR.

The implantation by the ion implantation process is performed using a mask including an undepicted photoresist film formed with a photolithography technique and the gate electrodes G1 and G2. Consequently, the n⁻ semiconductor regions N1 and N2 are formed separately from each other in the top of the active region AR. The n⁻ semiconductor regions N1 and N2 each have a substantially rectangular shape in plan view.

Specifically, each of the n⁻ semiconductor regions N1 and N2 has a rectangular shape extending in the longitudinal direction of the pixel array section (image area), in which pixels are arranged in rows and columns, in the solid-state imaging device formed in a later step. The n⁻ semiconductor regions N1 and N2 are formed side by side in the direction orthogonal to the longitudinal direction of the pixel array section (image area).

Part of the n⁻ semiconductor region N1 is formed in the semiconductor substrate SB in a region adjacent to the gate electrode G1, and part of the n⁻ semiconductor region N2 is formed in the semiconductor substrate SB in a region adjacent to the gate electrode G2. Specifically, the n⁻ semiconductor region N1 configures a source region of the transfer transistor TX1 that is a field effect transistor having the gate electrode G1, and is formed in a later step. The n⁻ semiconductor region N2 configures a source region of the transfer transistor TX2 that is a field effect transistor having the gate electrode G2, and is formed in a later step.

Part of the main surface of the semiconductor substrate SB directly below each of the gate electrodes G1 and G2 is a channel region, and has no n– semiconductor region N1 or N2 therein. As illustrated in FIG. 14, each of the n⁻ semiconductor regions N1 and N2 is formed with a depth deeper than the depth of the element isolating region EI and shallower than the well region WL.

Figure 15:
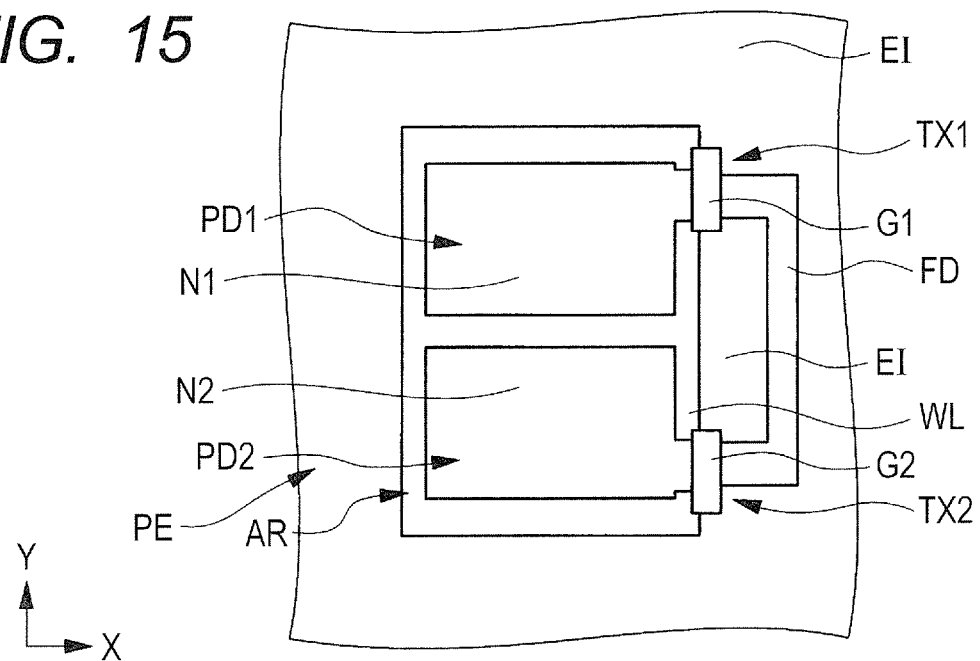
FIG. 15 is a plan view for explaining the manufacturing process of the semiconductor unit following FIG. 13.

Subsequently, as illustrated in FIG. 15, an n impurity (for example, arsenic (As) or phosphorous (P)) is implanted into a portion in the active region AR by, for example, an ion implantation process, thereby the floating diffusion capacitance section FD as an n impurity region is formed (step S7 of FIG. 7). This results in formation of the transfer transistor TX1 having the floating diffusion capacitance section FD as the drain region, the n⁻ semiconductor region N1 as the source region, and the gate electrode G1, and formation of the transfer transistor TX2 having the floating diffusion capacitance section FD as the drain region, the n⁻ semiconductor region N2 as the source region, and the gate electrode G2. In this step, the reset transistor, the amplifier transistor, and the selection transistor as the peripheral transistors are formed through forming source and drain regions in an undepicted region.

The floating diffusion capacitance section FD is formed in a region protruding from the rectangular light receiving section in the active region AR. Specifically, the active region AR is separated in the light receiving section having the photodiodes PD1 and PD2 and the floating diffusion capacitance section FD with the boundary including the gate electrodes G1 and G2 in plan view. The transfer transistors TX1 and TX2 share the floating diffusion capacitance section FD as the drain region. The drain regions of the transfer transistors TX1 and TX2 may be separated from each other in a layout. In such a case, the separated drain regions are electrically coupled to each other via a contact plug and an interconnection to be formed later.

A pixel PE including the photodiodes PD1 and PD2, the transfer transistors TX1 and TX2, and other undepicted peripheral transistors is formed through such steps. While not shown, a plurality of such pixels PE are formed while being arranged in a matrix in the pixel array section on the semiconductor substrate SB.

When an n photodiode is formed, the drain region is formed with an n impurity concentration larger than the n impurity concentration of each of the n⁻ semiconductor regions N1 and N2. Although a method of forming a photodiode, in which an impurity such as a p impurity (for example, boron (B)) is implanted shallower than the n⁻ semiconductor region N1 or N2 into a surface portion of the photodiode region such as the n⁻ semiconductor region N1 or N2 as illustrated in FIG. 14 to form a p⁺ layer, is used in some case, the following description is given with the case where the surficial p⁺ layer does not exist.

Figure 16:
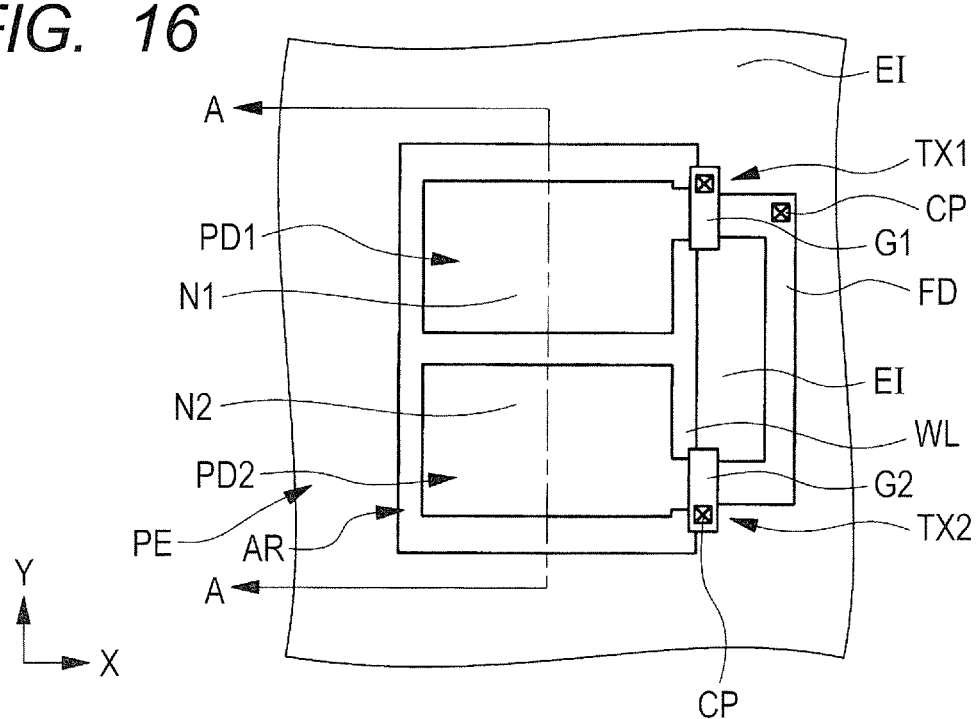
FIG. 16 is a plan view for explaining the manufacturing process of the semiconductor unit following FIG. 15.
Figure 17:
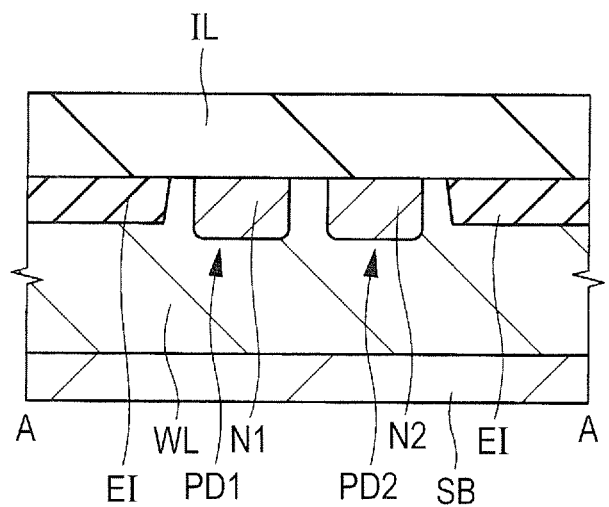
FIG. 17 is a section view for explaining the manufacturing process of the semiconductor unit following FIG. 15.

Subsequently, as illustrated in FIGS. 16 and 17, the interlayer insulating film IL is formed on the semiconductor substrate (step S8 of FIG. 7), and then contact plugs CP penetrating through the interlayer insulating film IL is formed (step S9 of FIG. 7).

The interlayer insulating film IL including, for example, a silicon oxide film is formed on the main surface of the semiconductor substrate SB by, for example, a chemical vapor deposition (CVD) process so as to cover the transfer transistors TX1 and TX2 and the photodiodes PD1 and PD2. Subsequently, a photoresist pattern is formed on the interlayer insulating film IL, and the interlayer insulating film IL is dry-etched with the photoresist pattern as a mask, thereby contact holes exposing the gate electrode G1, the gate electrode G2, and the floating diffusion capacitance section FD are formed. A silicide layer may be formed on the top of each of the gate electrode G1, the gate electrode G2, and the floating diffusion capacitance section FD. The contact hole is not formed directly above the light receiving section including the photodiodes PD1 and PD2.

Subsequently, a metal film is formed on the interlayer insulating film IL containing the insides of the contact holes, and then the metal film on the interlayer insulating film IL is removed by polishing with a chemical mechanical polishing (CMP) process, for example. This results in formation of the contact plugs CP including the metal film filling the respective contact holes. For example, each contact plug CP is comprised of a stacked film including a titanium nitride film covering the sidewall and the bottom of each contact hole and a tungsten film that is formed on the titanium nitride film covering the bottom while filling the contact hole.

Subsequently, while not shown, a first interconnection layer, which includes an interlayer insulating film and the interconnection M1 (see FIGS. 18 and 19) as a lower-layer interconnection, is formed on the interlayer insulating film IL (step S10 of FIG. 7). The lower-layer interconnection is formed by what is called a single damascene process.

In this case, the interlayer insulating film including, for example, a silicon oxide film is formed on the interlayer insulating film IL by a CVD process, for example. Subsequently, the interlayer insulating film is processed using a photolithography technique and a dry etching process to form an interconnection trench that is an opening penetrating through the interlayer insulating film and exposes the top of the interlayer insulating film IL and the top of each contact plug CP. Subsequently, a metal film is formed on the interlayer insulating film containing the inside of the interconnection trench, and an excess metal film on the interlayer insulating film is removed by a CMP process Or the like, resulting in formation of the interconnection M1 including the metal film filling the interconnection trench (see FIGS. 18 and 19). The interconnection M1 is not formed directly above each of the photodiodes PD1 and PD2.

The interconnection M1 has a stacked structure including a tantalum nitride film and a copper film stacked in this order, for example. The inner sidewall and the inner bottom of the interconnection trench are covered with the tantalum nitride film. The interconnection M1 is coupled at its bottom to the top of the contact plug CP.

Figure 18:
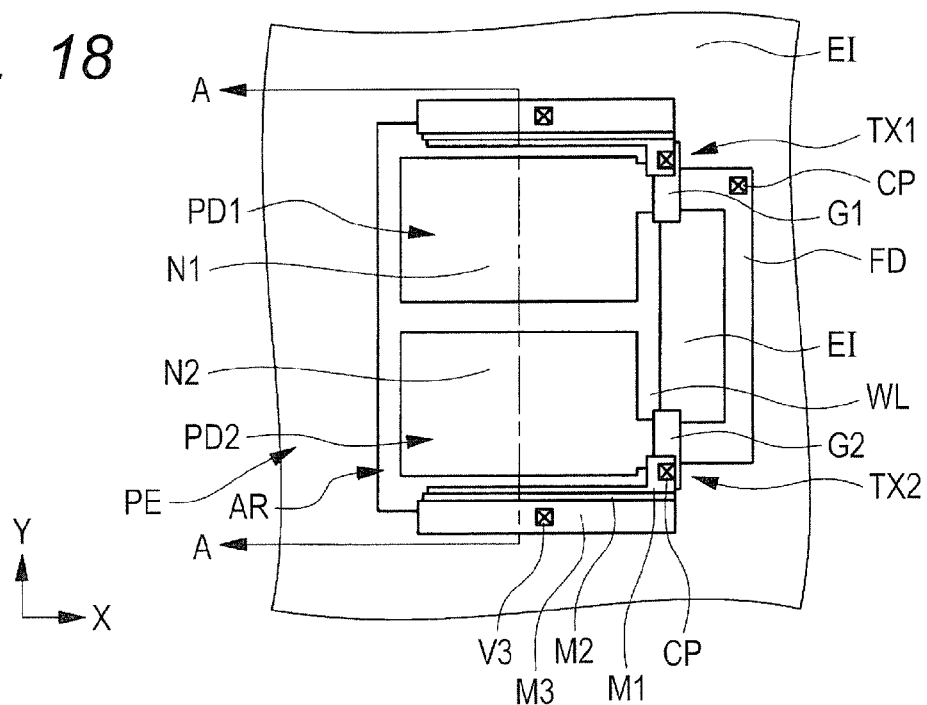
FIG. 18 is a plan view for explaining the manufacturing process of the semiconductor unit following FIG. 16.
Figure 19:
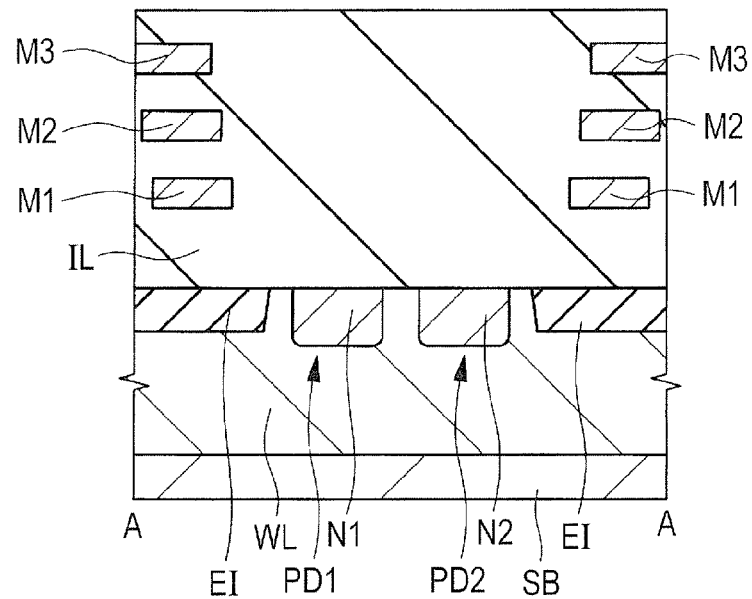
FIG. 19 is a section view for explaining the manufacturing process of the semiconductor unit following FIG. 16.

Subsequently, as illustrated in FIGS. 18 and 19, a plurality of interconnection layers containing a plurality of upper-layer interconnections are stacked on the interlayer insulating film (step S11 of FIG. 7). This results in formation of a stacked interconnection layer including the interlayer insulating film, the plurality of interlayer insulating films on the interlayer insulating film, the interconnection M1, the interconnections M2 and M3 as the plurality of upper-layer interconnections stacked on the interconnection M1. The interconnection M2 is formed on the interconnection M1 via an undepicted via, and the interconnection M3 is formed on the interconnection M2 via an undepicted via. Each upper-layer interconnection and each via under the upper-layer interconnection are formed by what is called a dual damascene process. FIG. 19 shows the plurality of interlayer insulating films stacked on the semiconductor substrate SB in a form of one interlayer insulating film IL.

The interconnection M2 and the interconnection M3 are each formed at a position more away from the photodiodes PD1 and PD2 than the interconnection M1 in plan view. That is, no interconnection is formed directly above each of the photodiodes PD1 and PD2. The interlayer insulating film IL is formed on the interconnection M3 as the top-layer interconnection in the stacked interconnection layer. FIG. 18 shows a via V3 formed between the interconnections M3 and M2 through the interconnection M3.

In the dual damascene process, for example, a via hole penetrating through an interlayer insulating film is formed, and then an interconnection trench shallower than the via hole is formed in the top of that interlayer insulating film, and then the via hole and the inside of the interconnection trench are filled with a metal, thereby the via in the via hole and the interconnection in the interconnection trench on the via are formed at the same time. However, a via hole penetrating from the bottom of the interconnection trench to the bottom of the interlayer insulating film may be formed after forming the interconnection trench. The via and the interconnections M2 and M3 mainly include a copper film. The interconnection M1 is electrically coupled to the interconnection M3 via the vias and the interconnection M2.

Figure 20:
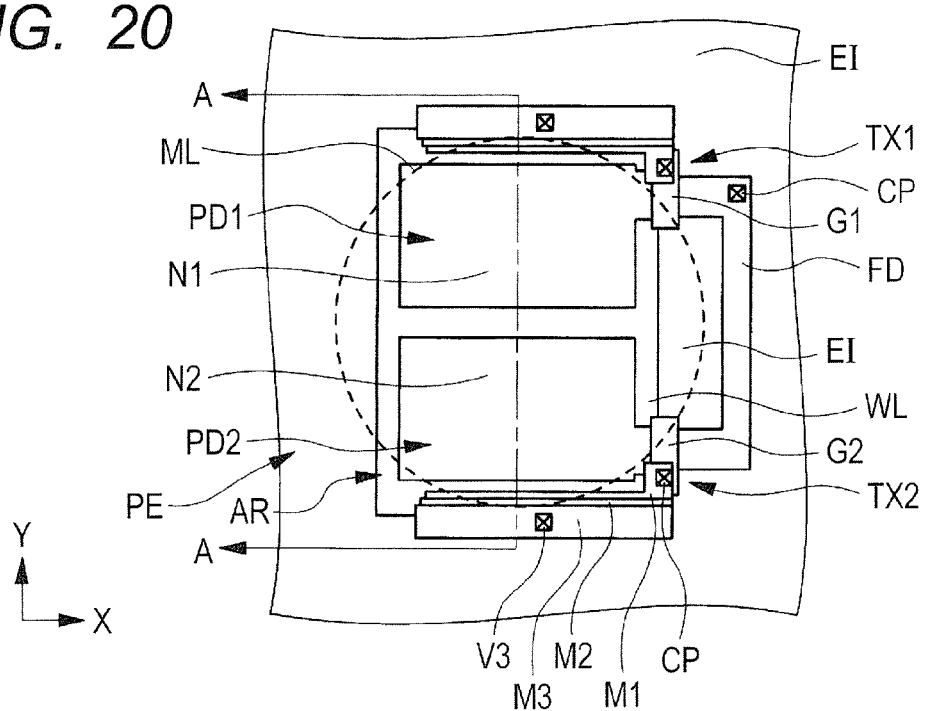
FIG. 20 is a plan view for explaining the manufacturing process of the semiconductor unit following FIG. 18.
Figure 21:
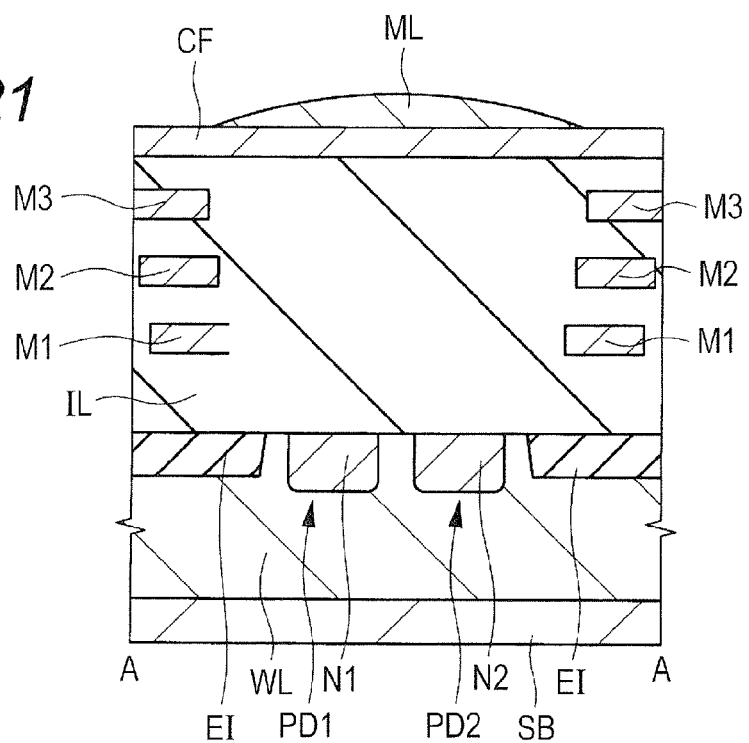
FIG. 21 is a section view for explaining the manufacturing process of the semiconductor unit following FIG. 18.

Subsequently, as illustrated in FIGS. 20 and 21, the color filter CF is formed on the interlayer insulating film IL (step S12 of FIG. 7), and then the microlens ML is formed on the color filter CF and directly above the pixel PE (step S13 of FIG. 7). FIG. 20 shows a contour of the microlens ML by a broken line. The microlens ML overlaps with the photodiodes PD1 and PD2 in plan view.

Although one pixel PE includes other transistors configuring the pixel in addition to the photodiodes PD1 and PD2 and the floating diffusion region, such transistors are not shown in the drawing for convenience.

For example, the color filter CF is formed by filling a trench formed in the top of the interlayer insulating film IL with a film including a material that transmits light having a predetermined wavelength and blocks light having a wavelength other than the predetermined wavelength. Formation of the color filter CF allows the photodiodes PD1 and PD2 to be irradiated with light of a specific color, for example. However, if the pixel may detect any color of light without limitation, the color filter CF may not be formed.

The microlens ML on the color filter CF is formed as follows: A film is formed on the color filter CF and processed into a circular pattern in plan view, and the film is then heated so that a surface of the film is rounded, and thus the film is processed into a lens shape.

In subsequent steps, the semiconductor substrate SB, i.e., a semiconductor wafer is cut into individual sensor chips through dicing along scribe lines of the semiconductor wafer, so that a plurality of solid-state imaging devices IS (see FIG. 2) comprised of the sensor chips are formed. This is the end of manufacturing of the semiconductor unit of the first embodiment including the solid-state imaging device IS illustrated in FIG. 2.

The first embodiment is largely characterized in that the photodiodes PD1 and PD2 comprised of the n-semiconductor regions N1 and N2, respectively, are provided side by side in the Y-axis direction orthogonal to the longitudinal direction (X-axis direction) of the pixel allay section PEA (see FIG. 2). The method of manufacturing the semiconductor unit of the first embodiment provides effects similar to those described with FIGS. 2, 6, 37, and 38.

Second Embodiment

Figure 22:
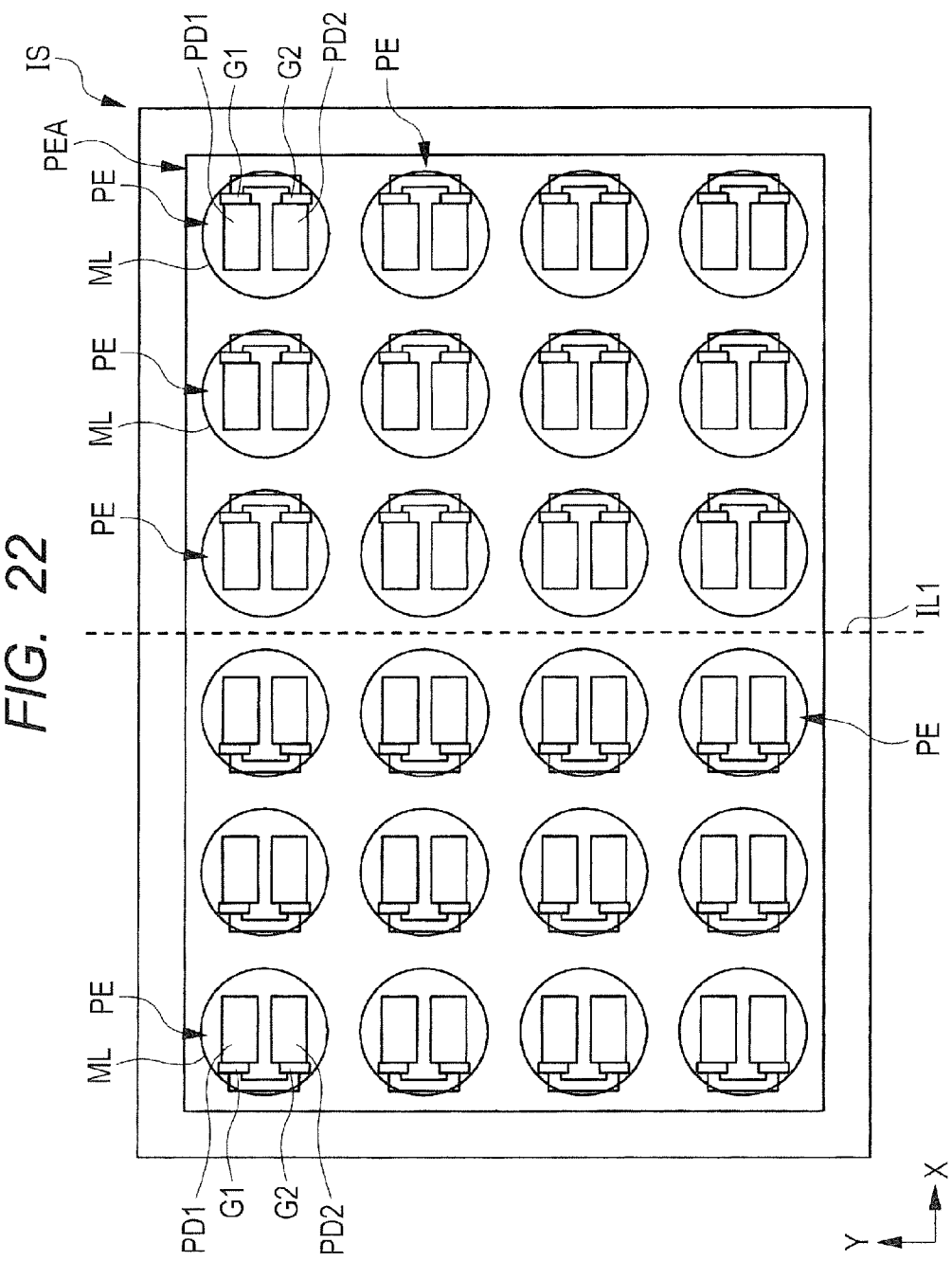
FIG. 22 is a plan view illustrating a semiconductor unit as a second embodiment of the invention.

In a second embodiment, each gate electrode in the pixel is disposed at a position distant from a central line passing through the center of the image area in plan view compared with the photodiode, which prevents light incident on the photodiode from being blocked by the gate electrode. FIG. 22 shows a plan view of a semiconductor unit of the second embodiment. Although FIG. 22 shows a completed solid-state imaging device IS, interconnections, vias, and interlayer insulating films are not shown for better understanding of the drawing. Since the semiconductor unit of the second embodiment can be formed by a manufacturing method similar to that of the first embodiment, description of the manufacturing method is omitted.

In the solid-state imaging device IS of the second embodiment illustrated in FIG. 22, as in the first embodiment, the photodiodes PD1 and PD2 of each pixel extend in the longitudinal direction (X-axis direction) of the pixel allay section PEA, and the photodiodes PD1 and PD2 are arranged in the Y-axis direction. Consequently, the effects similar to those in the first embodiment can be provided.

The solid-state imaging device IS of the second embodiment is designed such that, the gate electrode G1 adjacent to the photodiode PD1 is located closer to the third side than the photodiode PD1 in a pixel PE located close to the third side of the pixel allay section PEA with respect to a central line IL1 perpendicularly intersecting with each of the first side and the second side parallel to each other of the rectangular pixel allay section PEA in plan view. In that pixel PE, the gate electrode G2 adjacent to the photodiode PD2 is located closer to the third side than the photodiode PD2.

Similarly, the gate electrode G1 adjacent to the photodiode PD1 is located closer to the third side than the photodiode PD1 in a pixel PE located close to the fourth side of the pixel allay section PEA with respect to the central line IL1. In that pixel PE, the gate electrode G2 adjacent to the photodiode PD2 is located closer to the fourth side than the photodiode PD2. Other structural points are similar to those of the first embodiment.

Specifically, in the second embodiment, the photodiodes PD1 and PD2 in a predetermined pixel PE are located closer to the central line IL1 than the gate electrodes G1 and G2 adjacent to the photodiodes PD1 and PD2, respectively. The central line IL1 is a line that overlaps with the center of the pixel array section (image area) PEA in plan view, and perpendicularly intersects with each of the first side and the second side parallel to each other in the four sides of the rectangular pixel allay section PEA having the first to fourth sides. In other words, the pixels PE in the pixel allay section PEA are in a line-symmetric relationship with the central line IL1 as an axis in arrangement of the photodiodes PD1 and PD2 and the gate electrodes G1 and G2.

When a solid-state imaging device is formed, all pixels arranged in an image area are probably formed in the same planar layout. Hence, a gate electrode of a transfer transistor adjacent to a photodiode in any of the pixels is probably located close to predetermined one side of the image area with respect to the photodiode. In such a structure, however, when incident light has a large incidence angle at an end of the image area, the light is blocked by the gate electrode, and a decreased quantity of light is applied to the photodiode adjacent to that gate electrode. Such a decrease in the quantity of applied light due to light shielding by the gate electrode is more conspicuous at a longitudinal end than a lateral end of the image area (pixel array section).

When all the pixels in the image area have the same layout, light shielding by the gate electrode occurs in one half of the image area with a central line of the image area, which is along a direction orthogonal to a direction in which a photodiode and a gate electrode adjacent to the photodiode are arranged in a pixel, as a boundary, and the light shielding does not occur in the other half of the image area. That is, when an imaging device is divided into two, light shielding caused by the gate electrode may occur in one of the two divided regions, but the light shielding does not occur in the other region.

In one of the right and left regions divided by the central line of the image area, therefore, imaging performance such as sensitivity and image-plane phase-difference AF detection accuracy are reduced due to light shielding by the gate electrode. In particular, in AF operation, when autofocus is performed to an imaging object that is to be projected on the solid-state imaging device and moves from a left half face to a right half face, detection errors in a focusing condition increase at a boundary between the left and right regions.

In the second embodiment, therefore, the gate electrode G1 is disposed at a position more distant than the photodiode PD1 from the center of the pixel allay section PEA. In other words, the gate electrodes G1 and G2 in a pixel PE, which are close to one of the third side and the fourth side parallel to each other of the rectangular pixel allay section PEA, are disposed at positions closer to that one side than the photodiodes PD1 and PD2, respectively, in the pixel PE.

Hence, light applied from the central portion of the pixel allay section PEA in plan view is incident on the photodiodes PD1 and PD2 in each pixel PE without being blocked by the gate electrodes G1 and G2. It is therefore possible to prevent a reduction in imaging performance such as sensitivity due to shading by the gate electrodes G1 and G2, and thus prevent a reduction in autofocus accuracy and autofocus speed in the phase-plane phase-difference autofocus. Consequently, performance of the semiconductor unit can be improved.

Modification

Figure 23:
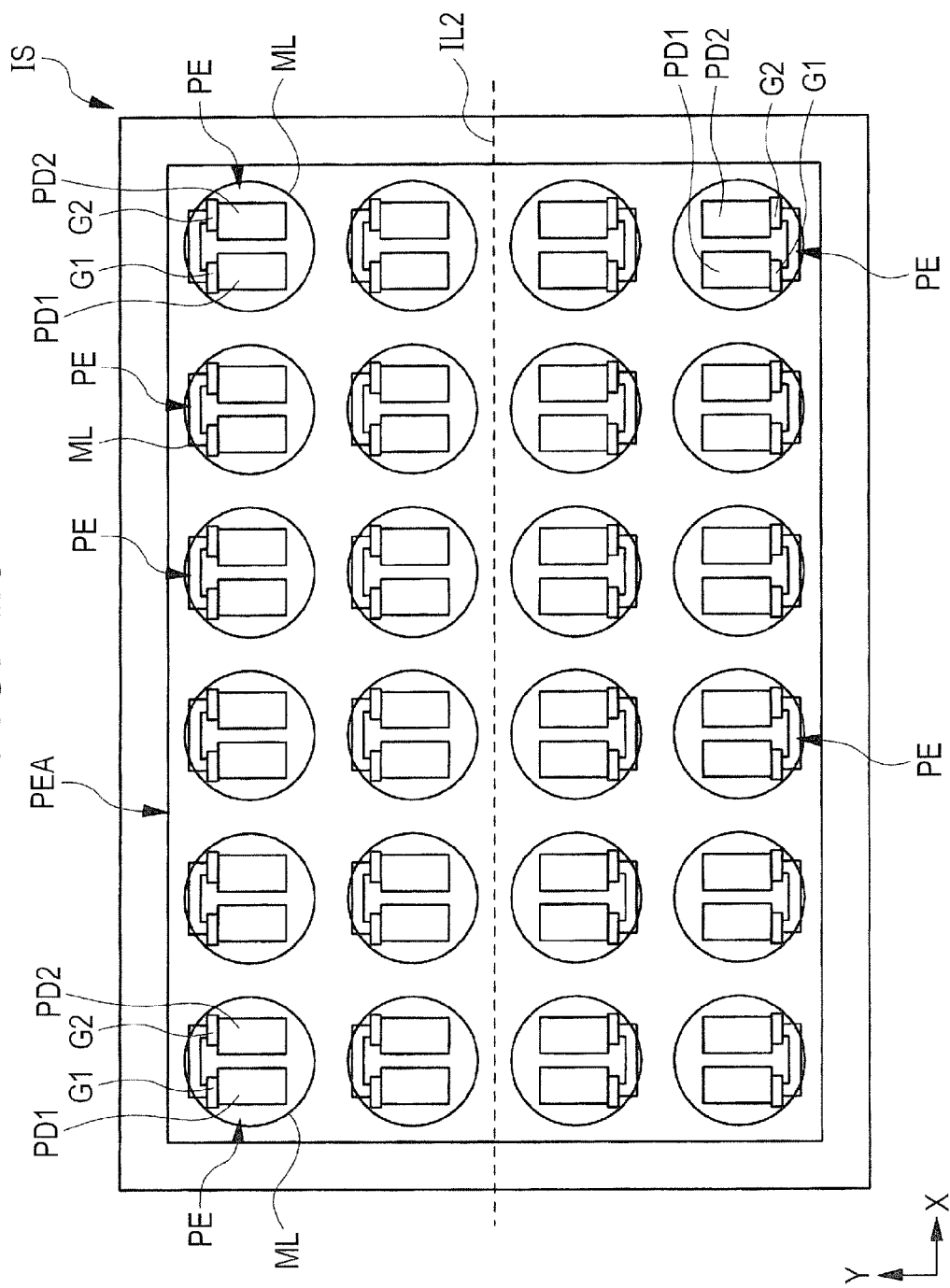
FIG. 23 is a plan view illustrating a semiconductor unit as a modification of the second embodiment of the invention.

FIG. 23 shows a plan view of a solid-state imaging device configuring a semiconductor unit as a modification of the second embodiment. In this modification, unlike the structure described with FIG. 22, the photodiodes PD1 and PD2 in each pixel PE are arranged in the longitudinal direction of the pixel allay section PEA, and each of the photodiodes PD1 and PD2 extends in a direction orthogonal to the longitudinal direction of the pixel allay section PEA. Although the central line IL1 of the pixel allay section PEA illustrated in FIG. 22 extends in the direction orthogonal to the longitudinal direction of the pixel allay section PEA, a central line IL2 of this modification illustrated in FIG. 23 extends along the longitudinal direction of the pixel allay section PEA.

Hence, the semiconductor unit is the same as the semiconductor unit described with FIG. 22 in that, in each pixel PE, the gate electrodes G1 and G2 of the transfer transistors are located on a side opposite to the photodiodes PD1 and PD2 with respect to the central line IL2. Consequently, the semiconductor unit of this modification provides the effects similar to those of the semiconductor unit described with FIG. 22.

However, the photodiodes PD1 and PD2 are arranged in the longitudinal direction of the pixel allay section PEA. This eliminates the effect described in the first embodiment, i.e., the effect of improving image-plane phase-difference autofocus performance by arranging the two photodiodes PD1 and PD2 in a pixel in the direction orthogonal to the longitudinal direction of the pixel allay section.

Third Embodiment

In a third embodiment, the two photodiodes in a pixel are isolated from each other by forming a p semiconductor region between the two photodiodes, thereby output balance between the two photodiodes is improved.

Figure 24:
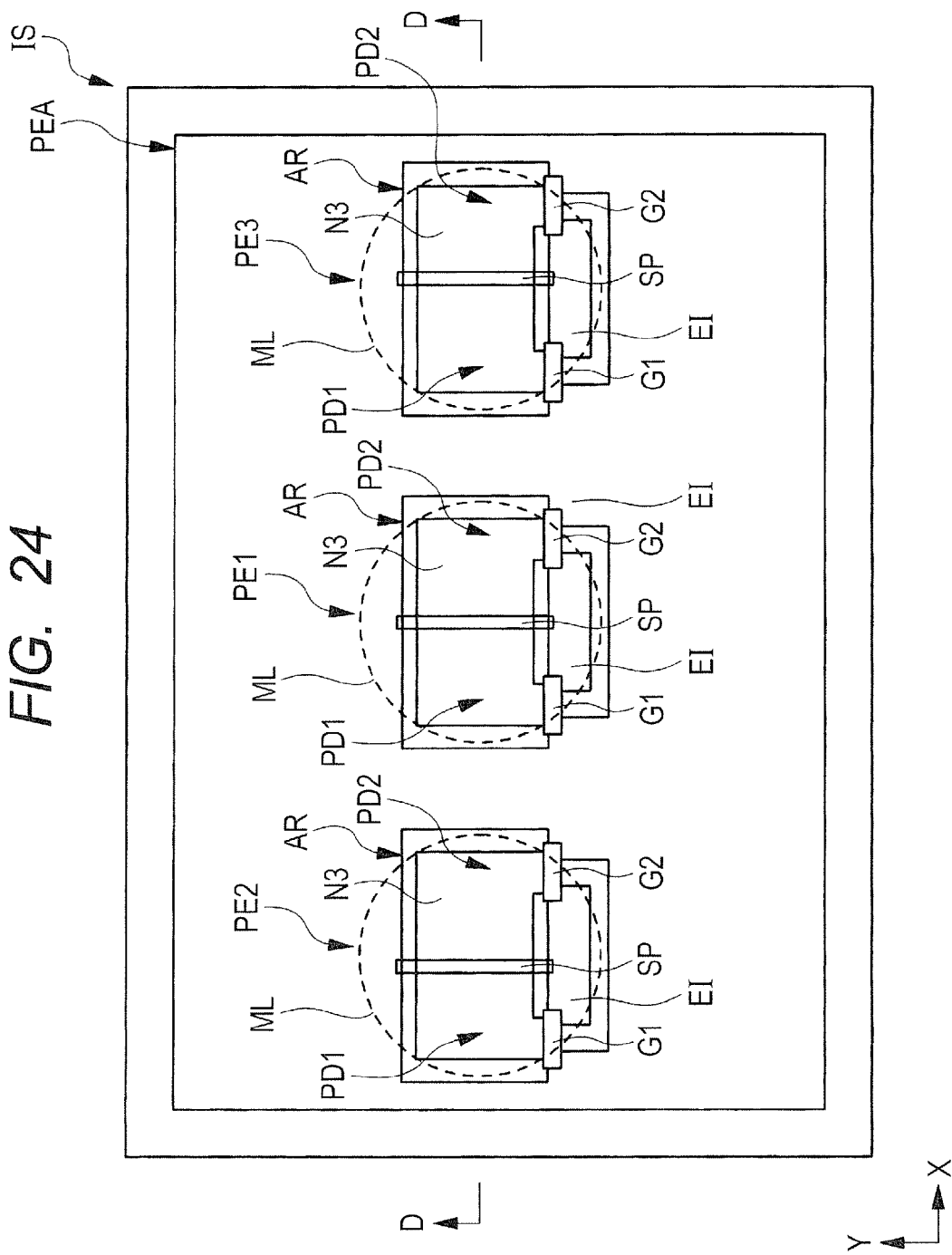
FIG. 24 is a plan view illustrating a semiconductor unit of a third embodiment of the invention.
Figure 25:
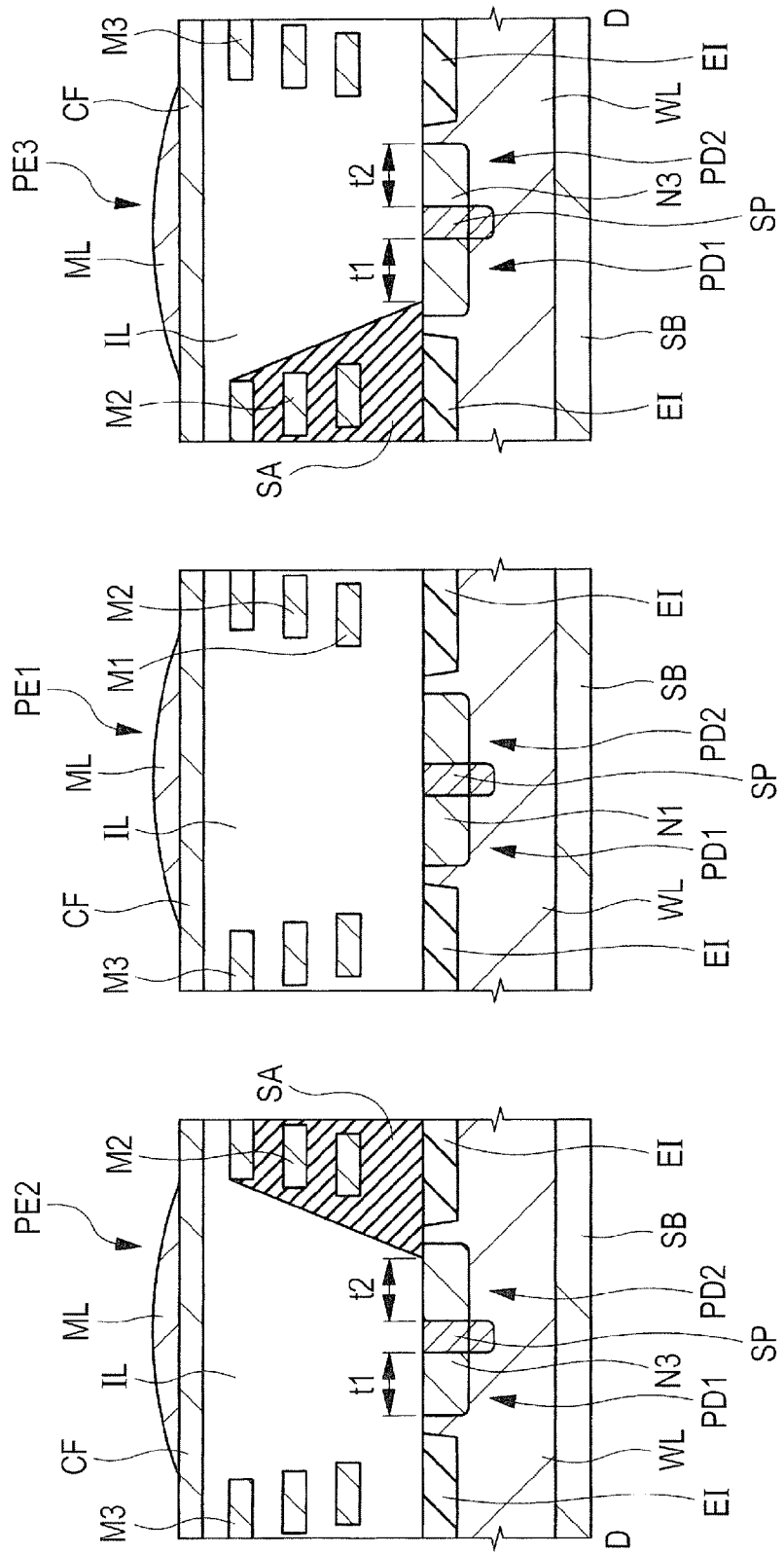
FIG. 25 is a section view along a line D-D in FIG. 24.

The semiconductor unit of the third embodiment is now described with FIGS. 24 and 25. FIG. 24 is a plan view of a solid-state imaging device as the semiconductor unit of the third embodiment. FIG. 25 is a section view along a line D-D in FIG. 24. FIG. 25 shows only sections of three pixels in the section view along the line D-D in FIG. 24. In FIGS. 24 and 25, left and right pixels PE2 and PE3 are pixels in two ends in the longitudinal direction of the pixel allay section PEA, and a pixel PE1 shown in the center of the drawing is a pixel in a central portion of the pixel allay section PEA.

FIGS. 24 and 25 each illustrate the pixels PE2, PE1, and PE3 in order from the left. Although FIG. 24 shows only the three pixels, a larger number of pixels are actually arranged in rows and columns in the pixel array section. In section views used in the following description, an interlayer insulating film on a semiconductor substrate may not be hatched for better understanding of the drawing.

Hereinafter, when the pixel in the end in the longitudinal direction of the pixel allay section PEA is described, the pixel PE2 is mainly described while the pixel PE3 may not be described. However, the pixel PE3 has a structure similar to that of the pixel PE2 except that its layout is a line-symmetric inversion of the layout of the pixel PE2. The following description is made on the assumption that the photodiode PD1 is disposed on the left of the drawing while the photodiode PD2 is disposed on the right of the drawing in any of the pixels in the pixel allay section PEA.

As illustrated in FIG. 24, in each of the pixels PE1 to PE3 of the third embodiment, the photodiodes PD1 and PD2 are arranged in the longitudinal direction (X-axis direction) of the pixel allay section PEA, and each of the photodiodes PD1 and PD2 extends in the Y-axis direction orthogonal to the longitudinal direction of the pixel allay section PEA. Other undepicted pixels in FIG. 24 each have a like structure. FIG. 25 shows a region in which a shadow is created because light incident on each of the pixels PE2 and PE3 is blocked by the interconnection M3, i.e., shows a shading region (shadow region) SA that is not irradiated with the light.

However, all the pixels in the pixel allay section PEA do not have the same layout. Specifically, in each pixel, while a separation region SP, which is a $p^+$ semiconductor region separating the photodiodes PD1 and PD2 from each other, is provided in the main surface of the semiconductor substrate, a formation position of the separation region SP may be different between the pixels. This is because while a plurality of pixels are disposed in rows and columns with a certain interval in the pixel allay section PEA, and a plurality of active regions AR, gate electrodes G1 and G2, and $n^-$ semiconductor regions N3 configuring the pixels are disposed in rows and columns with the same interval as that interval, the separation regions SP defining the pixels are disposed in rows and columns with an interval different from the interval.

The certain interval described in the third embodiment means a period with which the pixels, the elements, the semiconductor regions, or the gate electrodes are disposed. Specifically, for example, the interval between arranged pixels refers to a distance between the centers of two adjacent pixels rather than a distance between the ends of such two pixels near the intermediate point between the two pixels, i.e., rather than the shortest distance between the pixels.

Although FIGS. 24 and 25 show a region in which the $n^-$ semiconductor region N3 configuring the photodiodes PD1 and PD2 overlaps with the separation region SP, such a region is the separation region SP as a $p^+$ semiconductor region. In the first embodiment, the $n^-$ semiconductor regions N1 and N2 (see FIG. 3) are provided separately from each other; hence, the photodiodes PD1 and PD2 are separated from each other. On the other hand, in this embodiment, one $n^-$ semiconductor region N3 is provided in the light receiving section of each of the pixels PE1 to PE3, and the central portion of that n⁻ semiconductor region N3 is isolated by forming the separation region SP, thereby the photodiodes PD1 and PD2 are provided while being separated from each other.

Hence, one end in the X-axis direction of the separation region SP is in contact with the photodiode PD1 in plan view, and the other end in the X-axis direction of the separation region SP is in contact with the photodiode PD2 in plan view.

As illustrated in FIGS. 24 and 25, the pixels, the active regions AR, the gate electrodes G1 and G2, or the n⁻ semiconductor regions N3 in the pixel allay section PEA are arranged with the same first interval (arrangement period). The plurality of separation regions SP are disposed in rows and columns in a layout given by magnifying a layout of the separation regions SP in the entire pixel allay section PEA, the separation regions SP being disposed with the first interval (arrangement period), for example, 1.001 times with reference to the center of the pixel allay section PEA. The separation regions SP are therefore arranged with a second interval (arrangement period) larger than the first interval (arrangement period) of the n⁻ semiconductor regions N3.

Hence, the separation region SP in the pixel PE1 located in the central portion of the pixel allay section PEA is provided at the center of the rectangular n⁻ semiconductor region N3 in plan view. On the other hand, the separation region SP in the pixel PE2 located in the end of the pixel allay section PEA is provided closer to the end of the rectangular n⁻ semiconductor regions N3 than the center of the n⁻ semiconductor regions N3 in plan view. That is, a position of the separation region SP provided within a pixel is more greatly shifted from the central portion of the pixel toward the end of the pixel allay section PEA in a pixel located close to that end than in a pixel in the central portion of the pixel allay section PEA. In the pixel PE3, as with the pixel PE2, the formation position of the separation region SP is disposed while being shifted toward the end of the pixel allay section PEA near the pixel PE3 with respect to the center of the n⁻ semiconductor regions N3.

Since the pixels, the active regions AR, the n⁻ semiconductor regions N3, and the gate electrodes G1 and G2 are arranged with the same first interval in plan view, the separation region SP is provided while being shifted not only from the center of the n⁻ semiconductor region N3 but also from the center of each of the pixel and the active region AR in each of the pixels PE2 and PE3. In the pixel PE2 closer to the end of the pixel allay section PEA than the pixel PE1, the formation position of the separation region SP is shifted toward that end with respect to the gate electrodes G1 and G2 in plan view.

In the pixel PE2 located in a first end in the X-axis direction of the pixel allay section PEA, the separation region SP is disposed at a position as described below in the X-axis direction in which the two photodiodes PD1 and PD2 are arranged in order from the first end side. Specifically, the separation region SP is disposed at a position that is shifted toward the first end in the X-axis direction with respect to the intermediate point between a second end being an end of the photodiode PD1 in the pixel PE2 and located close to the first end in the X-axis direction, and a third end being an end of the photodiode PD2 in the pixel PE2 and located close to the central portion of the pixel allay section PEA.

In other words, the separation region SP is located closer to the first end than the center in the X-axis direction of the pattern including the photodiodes PD1 and PD2 in the pixel PE2.

Hence, in the pixel PE2, width in the X-axis direction of the n⁻ semiconductor region N3 distant from the first end with respect to the separation region SP is larger than width in the X-axis direction of the n⁻ semiconductor region N3 close to the first end with respect to the separation region SP. Hence, in the pixel PE2, the photodiode PD2 distant from the first end with respect to the separation region has a larger exposed area on the main surface of the semiconductor substrate in plan view than the photodiode PD1 close to the first end with respect to the separation region SP.

In the third embodiment, there is described shift of the formation position of the separation region SP from a predetermined position such as, for example, the center of the n⁻ semiconductor regions N3 in some pixel. This however is not limited to the case where the separation region SP is not provided in the predetermined position, but includes the case where part of the separation region SP is provided in the predetermined position. That is, for example, the condition that the formation position of the separation region SP is shifted from the center of the n⁻ semiconductor regions N3 includes a condition that the center of the n⁻ semiconductor region N3 overlaps with the end of the separation region SP in plan view. That is, the shift described herein means that the center in the X-axis direction of the separation region SP does not overlap, i.e., is misaligned, with the center of the n⁻ semiconductor regions N3 in plan view.

In this way, the layout of the entire pixel allay section PEA is expanded only for the separation region SP, so that the formation position of the separation region SP is corrected. This is because such correction prevents the following trouble: Incident light is blocked by the interconnection in the pixel PE2 or PE3 in the end of the pixel allay section PEA, leading to a reduction in output balance between the photodiodes PD1 and PD2 in the pixel.

Effects of the semiconductor unit of the third embodiment are now described with FIG. 39. FIG. 39 shows a section view of a semiconductor unit of a comparative example. FIG. 39 illustrates a pixel PE5 located in one end of the pixel array section, a pixel PE4 located at a central portion thereof, and a pixel PE6 located in the other end thereof in order from the left as in FIG. 25. Although FIG. 39 shows the n⁻ semiconductor regions N1 and N2 separated from each other with the well region WL in between, the solid-state imaging device of this comparative example may include one n⁻ semiconductor region separated by a separation region as with each pixel illustrated in FIG. 25.

As illustrated in FIG. 39, the pixels PE4 to PE6 of the solid-state imaging device of this comparative example each include the undepicted gate electrodes G1 and G2, the active region AR, the n⁻ semiconductor regions N1 and N2, and the photodiodes PD1 and PD2 that are provided in the same layout between the pixels PE4 to PE6. Specifically, in this comparative example, the pixels, the gate electrodes of the transfer transistors, the active regions AR, and the n⁻ semiconductor regions N1 and N2 in the entire pixel array section are arranged in rows and columns with the same first interval. Hence, a positional relationship between the undepicted gate electrodes and the photodiodes PD1 and PD2 in plan view is the same between the pixels PE4 and PE5, and area in plan view is not different between the photodiodes PD1 and PD2 in each of the pixels PE5 and PE6.

An incidence angle of light applied to the solid-state imaging device from an exit pupil directly above the center of the pixel array section is large at an end of the pixel array section (image area). In each of the pixels PE5 and PE6 in the end, therefore, the incident light is blocked by the interconnection M3, and thus the shading region SA to be a shadow is formed, and part of the shading region SA overlaps with the photodiode PD1 or PD2 closer to the center of the pixel array section. Since the portion where the shading region SA overlaps with the photodiode PD1 or PD2 is not irradiated with light during photographing, the portion does not serve as a photoelectric conversion element.

Specifically, for example, in the pixel PE5, since the number of electrons provided through photoelectric conversion is smaller in the photodiode PD2 close to the center of the pixel array section than in the photodiode PD1 close to the end of the pixel array section, output of the photodiode PD2 is extremely reduced compared with output of the photodiode PD1.

In this way, when one of the two photodiodes in a pixel overlaps with the shading region, and if the two photodiodes have the same area, output balance between the two photodiodes is reduced. In such a case, autofocus accuracy and autofocus speed in the phase-plane phase-difference autofocus are disadvantageously reduced due to a difference in output between the two photodiodes.

To deal with such a problem, it is considered to take a measure to reduce a bad influence of oblique incident light through a correction (pupil correction) of reducing a layout of the microlens ML in the entire image area to 99%, for example. However, even if such pupil correction is performed, since a large image area increases an incidence angle of incident light at the end of the image area, property balance between the two photodiodes in each pixel may be difficult to be maintained constant.

In contrast, in the third embodiment, the $n^-$ semiconductor region N3 provided one for each pixel in the pixel allay section PEA as shown in FIG. 24 is separated into two by the separation region SP, thereby the photodiodes PD1 and PD2 are separately disposed, and the plurality of separation regions SP in the entire pixel allay section PEA are provided with an enlarged, second interval (arrangement period). As illustrated in the pixels PE2 and PE3 in FIG. 25, a position of the separation region SP is determined such that width t1 of the photodiode PD1 that does not overlap with the shading region SA is equal to width t2 of the photodiode PD2 that does not overlap with the shading region SA in the X-axis direction in which the photodiodes PD1 and PD2 are arranged.

Hence, in the pixel PE2, the width t1 of the photodiode PD1 in the X-axis direction is smaller than a distance corresponding to the sum of the width t2 of the photodiode PD2 that does not overlap with the shading region SA and a width of the photodiode PD2 that overlaps with the shading region SA. That is, although area of the photodiode PD1 of the pixel PE2 is smaller than area of the photodiode PD2 of the pixel PE2, the photodiodes PD1 and PD2 have roughly the same light receiving area. Consequently, it is possible to prevent a reduction in output balance between the photodiodes PD1 and PD2.

Hence, a difference in output between the two photodiodes can be reduced, which makes it possible to prevent a reduction in autofocus accuracy and in autofocus speed in the phase-plane phase-difference autofocus due to such a difference in output, and thus performance of the semiconductor unit can be improved.

When the structure described with FIGS. 24 and 25 is used, pupil correction of changing a scale of the entire microlens ML as described above may be further performed.

In this embodiment, one $n^-$ semiconductor regions N3 in each pixel is separated into two by providing the separation region SP and thus the photodiodes PD1 and PD2 are isolated from each other. Hence, isolation properties of the photodiodes PD1 and PD2 can be improved compared with a case where the $n^-$ semiconductor regions N1 and N2 (see FIG. 39) separated with the well region WL in between are provided as in the comparative example. The isolation property described herein refers to property of preventing transfer of electrons caused by photoelectric conversion between the photodiodes PD1 and PD2.

Figure 31:
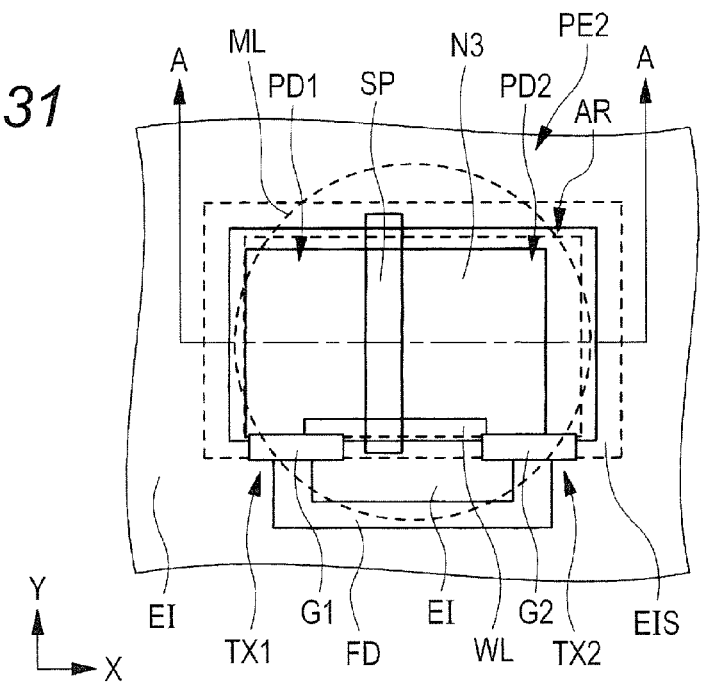
FIG. 31 is a plan view illustrating the semiconductor unit of the first modification of the third embodiment of the invention.
Figure 32:
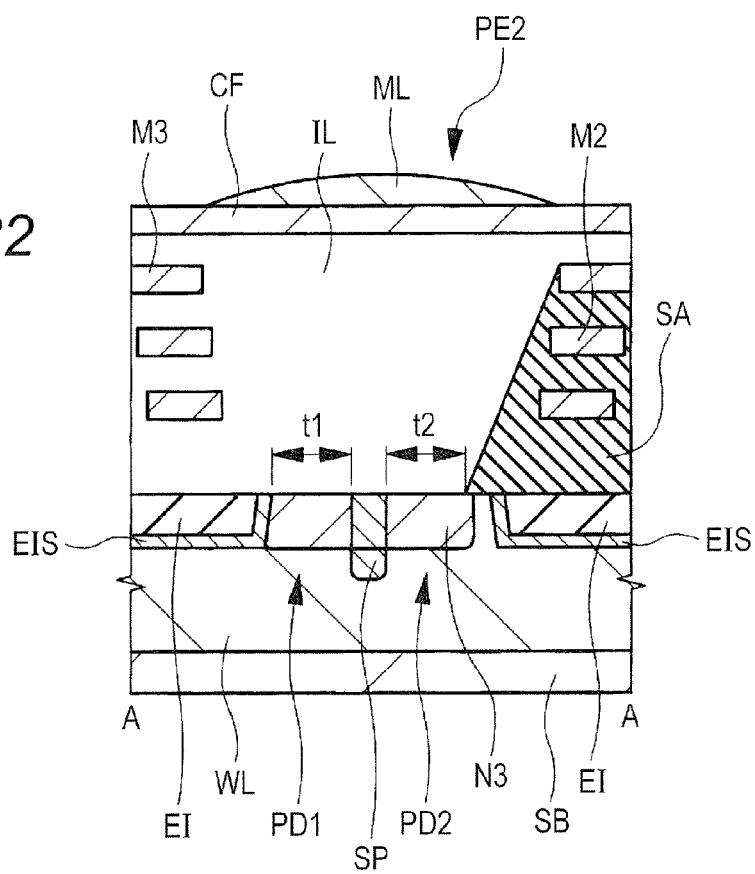
FIG. 32 is a section view along a line A-A in FIG. 31.

In the third embodiment, since a scale for the plurality of $n^-$ semiconductor regions N3 in the entire pixel allay section PEA is not changed, the $n^-$ semiconductor region N3 in any pixel is not close to the element isolating region EI. Hence, even if a p semiconductor region EIS to be described with FIGS. 31 and 32 is provided in the surface of the semiconductor substrate SB in contact with the element isolating region EI, the semiconductor region EIS is not close to the $n^-$ semiconductor region N3. It is therefore possible to prevent generation of dark electrons caused by overlap between a region where an n-impurity is implanted and a region where a p-impurity is implanted.

Figure 26:
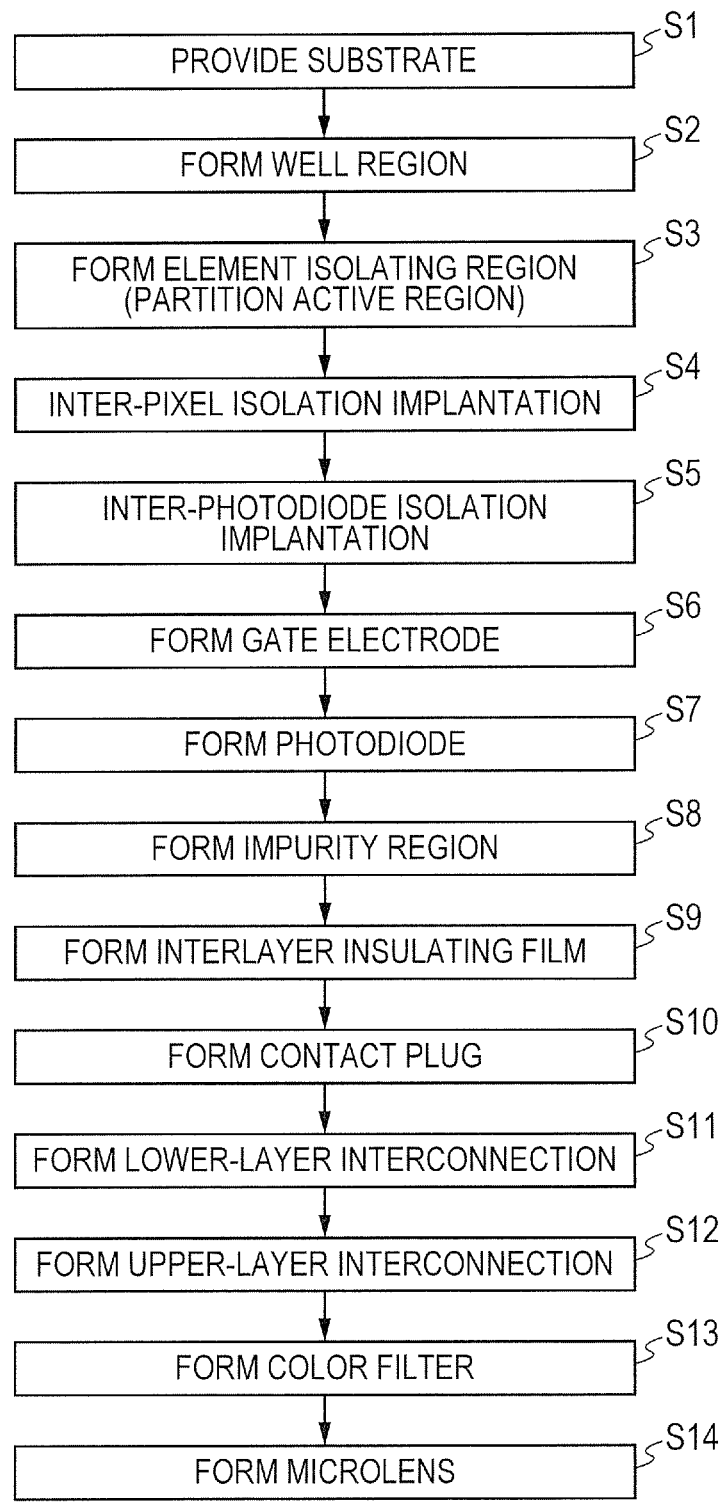
FIG. 26 is a diagram illustrating a procedure of a manufacturing process of the semiconductor unit of the third embodiment of the invention.
Figure 27:
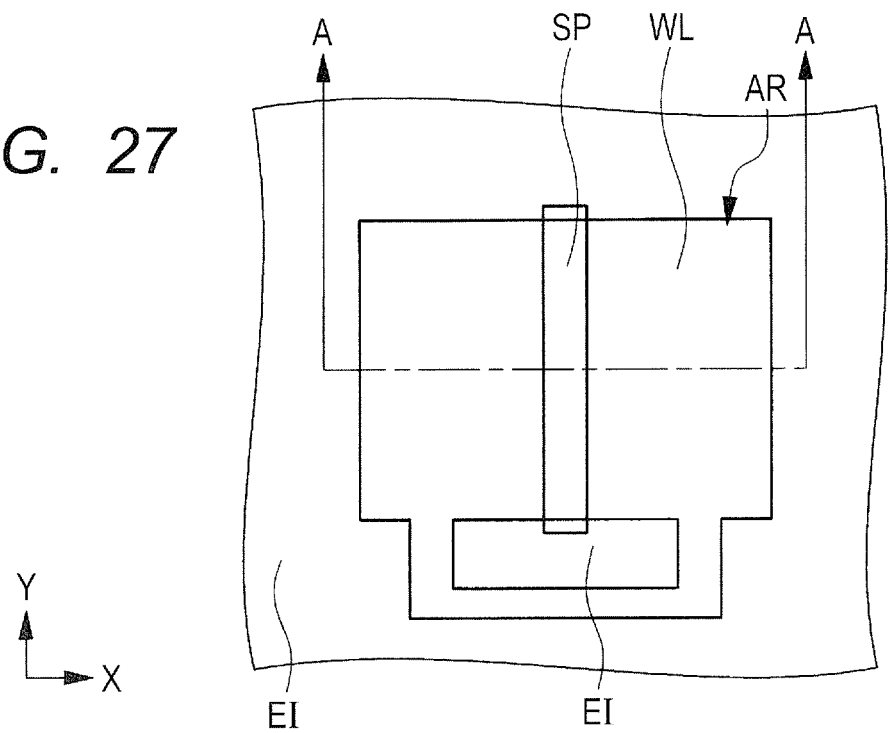
FIG. 27 is a plan view for explaining the manufacturing process of the semiconductor unit of the third embodiment of the invention.
Figure 28:
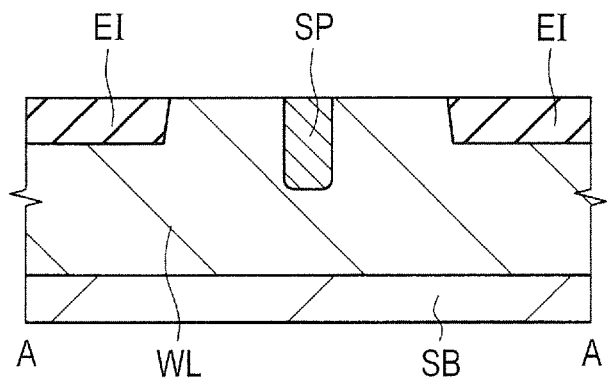
FIG. 28 is a section view for explaining the manufacturing process of the semiconductor unit of the third embodiment of the invention.

A manufacturing process of the semiconductor unit of the third embodiment is now described with FIGS. 26 to 28. FIG. 26 is a diagram illustrating a procedure of the manufacturing process of the semiconductor unit of the third embodiment. FIG. 27 is a plan view for explaining the manufacturing process of the semiconductor unit of the third embodiment. FIG. 28 is a section view along a line A-A in FIG. 27. FIGS. 28 and 27 exemplarily show a formation process of the pixel PE1 (see FIG. 24) in the central portion of the pixel array section.

The manufacturing process is roughly the same as the process described with FIGS. 7 to 21 in the first embodiment, but is different from the process in the first embodiment in that an inter-photodiode isolation implantation step (step S5 in FIG. 26) is added. In addition, unlike the first embodiment, one $n^-$ semiconductor region is formed in the active region of each pixel (step S7 in FIG. 26). The one $n^-$ semiconductor region is separated by the separation region that is previously formed through the inter-photodiode isolation implantation step, thereby two photodiodes isolated from each other are formed. The inter-photodiode isolation implantation step may be performed at any time point after a well region formation step (step S2 in FIG. 26) and before an impurity region formation step (step S8 in FIG. 26).

In the manufacturing process of the semiconductor unit of the third embodiment, the steps described with FIGS. 7 to 10 in the first embodiment are performed, and then impurity implantation for isolating two photodiodes to be formed later in a pixel from each other, i.e., inter-photodiode isolation implantation is performed as illustrated in FIGS. 27 and 28 (step S5 in FIG. 26). A p impurity (for example, boron (B)) is implanted by an ion implantation process or the like between respective regions in the top of the semiconductor substrate SB, in which the two photodiodes are to be formed in the active region AR in a later step. Consequently, the separation region SP as a $p^+$ semiconductor region is formed in the top of the semiconductor substrate SB.

As illustrated in FIG. 27, the separation region SP has a shape extending in the Y-axis direction from one side of the active region AR having a rectangular planar shape to another side opposed to the one side. Each of the two ends of the separation region SP overlaps with the element isolating region EI in plan view in the Y-axis direction. Specifically, the two ends of the separation region SP are provided under the element isolating region EI.

As illustrated in FIG. 28, the separation region SP is formed from the main surface of the semiconductor substrate SB to an intermediate depth of the semiconductor substrate SB. The bottom of the separation region SP is terminated at the intermediate depth in the well region WL or at the interface between the well region WL and the semiconductor substrate SB. The depth of the separation region SP is deeper than the depth of the n⁻ semiconductor regions N3 (see FIG. 25) to be formed later. This is because the separation region SP must separate the n⁻ semiconductor regions N3 into right and left.

In the inter-photodiode isolation implantation forming the separation region SP (step S5 in FIG. 26), the arrangement layout of the plurality of separation regions SP to be formed over the entire image area is expanded with reference to the center of the image area compared with the arrangement layout of the plurality of active regions AR that are to be formed while being arranged with the predetermined first interval over the entire image area. Consequently, the plurality of separation regions SP are provided while being arranged in rows and columns with a second interval larger than the first interval.

Correction of changing the scale of the layout of the separation regions SP is thus performed, thereby the separation region SP is formed while being shifted toward an end of the image area in a pixel in that end compared with a pixel in the central portion of the image area. At this time, when one of the two photodiodes in the pixel overlaps with the shading region caused by an interconnection or the like in the end of the image area of the completed solid-state imaging device, the separation region SP is formed at a position such that widths of the tops of the photodiodes exposed from the shading region are equal to each other in a direction in which the photodiodes are arranged.

Subsequently, the steps described with FIGS. 16 to 21 in the first embodiment are performed, so that the semiconductor unit of the third embodiment illustrated in FIGS. 24 and 25 is completed. As described above, however, unlike the first embodiment, one n⁻ semiconductor region N3 is formed in the active region of each pixel in step 7 shown in FIG. 26. In the n⁻ semiconductor regions N3 isolated by the beforehand formed separation region SP, one n⁻ semiconductor region N3 configures the photodiode PD1, and the other n⁻ semiconductor region N3 configures the photodiode PD2. That is, the layout of the photodiodes PD1 and PD2 is determined by the formation position of the separation region SP.

The manufacturing process of the third embodiment provides effects similar to those of the semiconductor unit described with FIGS. 24 and 25.

Specifically, as shown in the pixels PE2 and PE3 in FIG. 25, the separation region SP is disposed such that the width t1 of the photodiode PD1 that does not overlap with the shading region SA is equal to the width t2 of the photodiode PD2 that does not overlap with the shading region SA in the X-axis direction in which the photodiodes PD1 and PD2 are arranged. Consequently, since a reduction in output balance between the photodiodes PD1 and PD2 can be prevented, making it possible to prevent a reduction in autofocus accuracy and in autofocus speed in the phase-plane phase-difference autofocus. Hence, performance of the manufactured semiconductor unit can be improved.

First Modification

Figure 29:
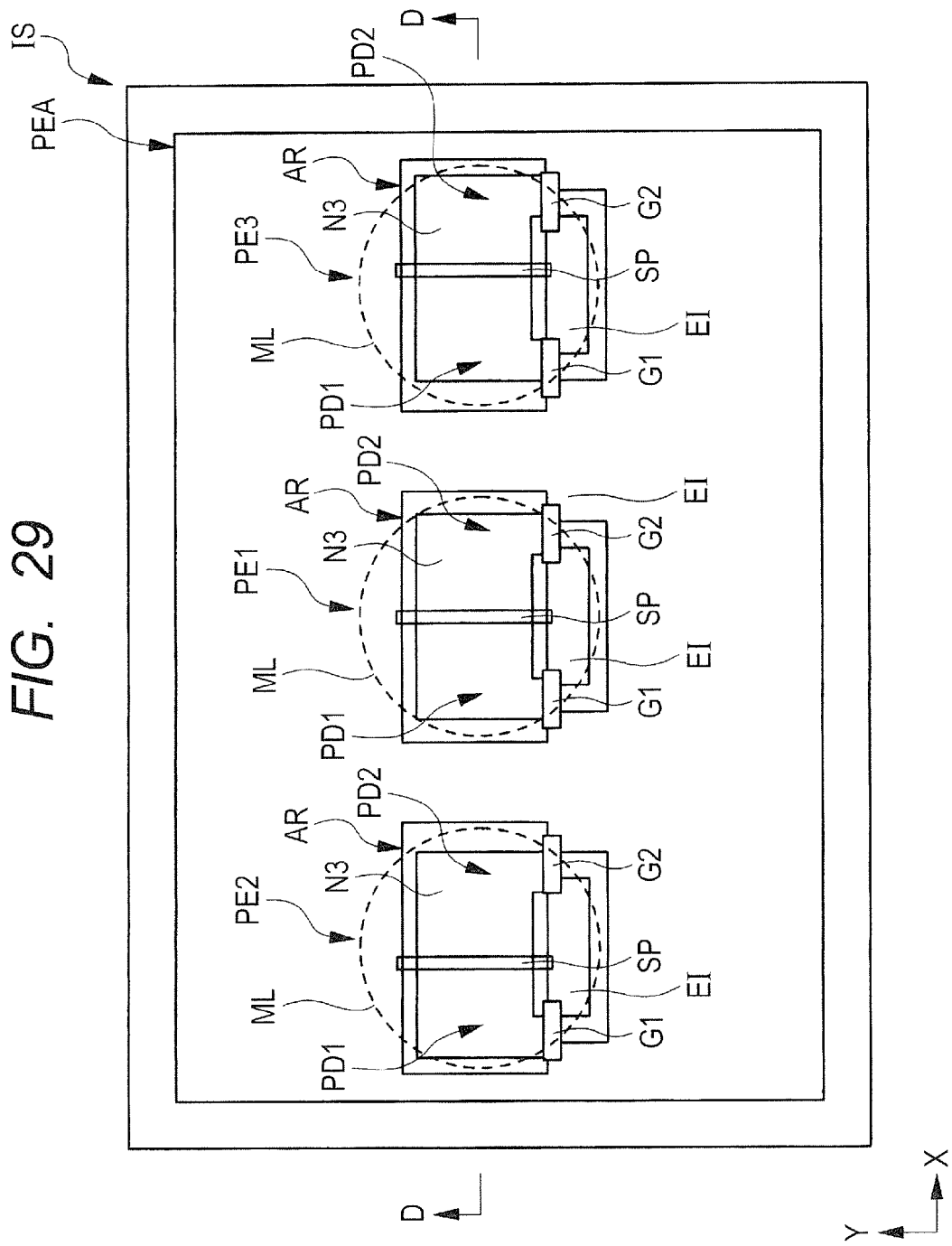
FIG. 29 is a plan view illustrating a semiconductor unit of a first modification of the third embodiment of the invention.
Figure 30:
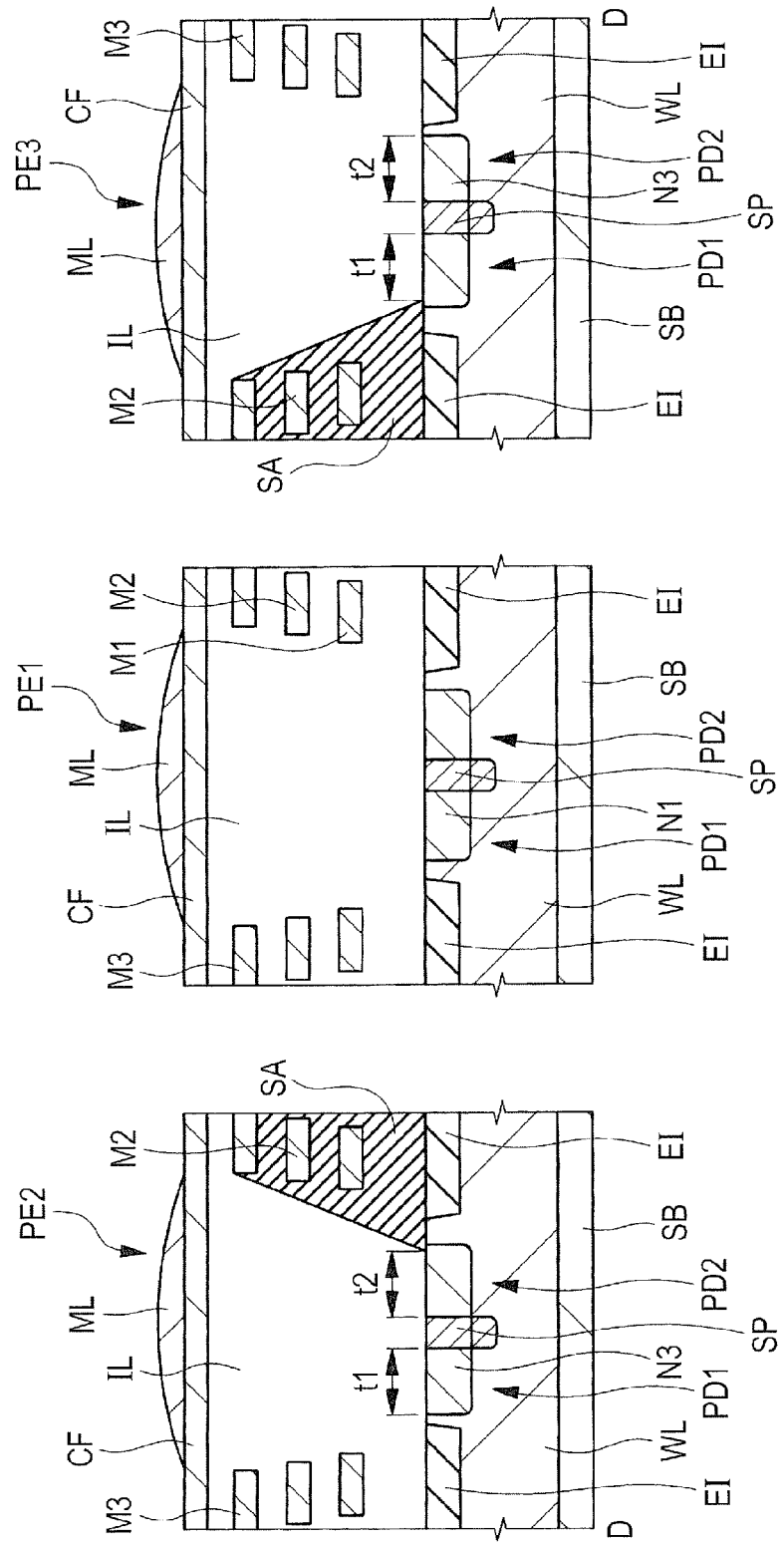
FIG. 30 is a section view along a line D-D in FIG. 29.

A first modification of the third embodiment is now described with FIGS. 29 and 30. FIG. 29 is a plan view of a solid-state imaging device as a semiconductor unit of the third embodiment. FIG. 30 is a section view along a line D-D in FIG. 29. As with FIGS. 24 and 25, FIGS. 29 and 30 each illustrate a pixel PE2 in one end in the longitudinal direction of the pixel allay section PEA, a pixel PE1 in the central portion of the pixel allay section PEA, and a pixel PE3 in the other end in the longitudinal direction of the pixel allay section PEA in order from the left of the drawing.

In the first modification, as with the solid-state imaging device described with FIGS. 24 and 25, one n⁻ semiconductor region N3 is separated into two by a separation region SP formed with a corrected scale, so that the photodiodes PD1 and PD2 are provided. However, unlike the solid-state imaging device described with FIGS. 24 and 25, the n⁻ semiconductor region N3 is also subjected to correction of expanding the layout over the entire pixel allay section PEA. In the pixel PE2 close to the end of the pixel allay section PEA illustrated in FIG. 29, therefore, the n⁻ semiconductor region N3 is disposed while being shifted to a position close to that end compared with the pixel PE1.

Specifically, the position of the n⁻ semiconductor region N3 with respect to the active region AR or the gate electrodes G1 and G2 in the pixel PE2 close to the end of the pixel allay section PEA is in a region close to that end compared with the position of the n⁻ semiconductor region N3 with respect to the active region AR or the gate electrodes G1 and G2 in the pixel PE1.

That is, the shortest distance in the X-axis direction between the photodiode PD1, which is provided closer to the first end than the photodiode PD2, and the element isolating region EI in the pixel PE2 is smaller than the shortest distance in the X-axis direction between the photodiode PD1, which is provided closer to the first end than the photodiode PD2, and the element isolating region EI in the pixel PE1.

In the first modification, as with the solid-state imaging device described with FIGS. 24 and 25, one n⁻ semiconductor region N3 is separated by the separation region SP formed with the corrected scale, so that the photodiodes PD1 and PD2 are provided. Consequently, effects similar to those in the first embodiment can be provided.

In addition, in the first modification, the scale of the n⁻ semiconductor region N3 is corrected, thereby the formation position of the n⁻ semiconductor region N3 in the pixel PE2 in the end of the pixel allay section PEA can be disposed while being shifted toward that end; hence, a region, in which the shading region (shadow region) SA shown in FIG. 30 overlaps with the photodiode PD2, can be reduced. It is therefore possible to prevent a reduction in sensitivity of a pixel due to formation of the shading region SA.

In the first modification in which an overlapping region between the shading region SA and the photodiode PD2 is reduced, the separation region SP is also disposed at a predetermined position such that the width t1 of the photodiode PD1 that does not overlap with the shading region SA is equal to the width t2 of the photodiode PD2 that does not overlap with the shading region SA in the X-axis direction in which the photodiodes PD1 and PD2 are arranged. In the photodiodes PD1 and PD2 of the pixel PE2 in the end of the pixel allay section PEA, only the photodiode PD2 closer to the central portion of the pixel allay section PEA is invaded by the shading region SA. In the first modification, therefore, the separation region SP is also disposed while being shifted to a position closer to the end than the center of the n⁻ semiconductor region N3.

However, when the semiconductor region EIS is formed as an ion stopper region or a guard ring region in the surface of the semiconductor substrate SB in contact with the element isolating region EI, it is considered to further change the formation position of the separation region SP formed to adjust the width t1 and the width t2 to be equal to each other. As illustrated in FIGS. 31 and 32, the semiconductor region EIS is a p semiconductor region provided in the semiconductor substrate SB in the vicinity of the element isolating region EI. FIG. 31 is a plan view of the semiconductor unit of the first modification. FIG. 32 is a section view along a line A-A in FIG. 31. FIGS. 31 and 32 show the pixel PE2 in the end of the pixel array section. FIG. 32 shows the interlayer insulating film IL being not hatched for better understanding of the drawing.

The semiconductor region EIS is used as a channel stopper provided to prevent formation of a channel in the vicinity of an interface between the element isolating region EI and the semiconductor substrate SB, or used as the guard ring region to cancel and remove dark electrons caused by a defect or stress generated in the vicinity of the interface between the element isolating region EI and the semiconductor substrate SB.

A channel may be formed directly under the element isolating region EI due to a gate interconnection provided on the element isolating region EI. In such a case, even if active regions are intended to be isolated from each other by the element isolating region EI, a small leakage current is generated between the active regions. To suppress formation of the channel causing such generation of the leakage current, the semiconductor region EIS is formed as the channel stopper as described above.

The dark electrons are generated in the light receiving section even if a pixel is not irradiated with light. If such electrons are captured by the photodiode, an originally dark portion disadvantageously becomes bright in an image given by a solid-state imaging device. This means deterioration of dark characteristics of the solid-state imaging device.

To suppress occurrence of a problem in the vicinity of the interface between the element isolating region EI and the surface of the semiconductor substrate SB, the semiconductor region EIS is provided in a relatively shallow region in the vicinity of the main surface of the semiconductor substrate SB, the region containing the surface of the semiconductor substrate SB in contact with the element isolating region EI.

The semiconductor region EIS is provided in the surface of the semiconductor substrate SB along the interface between the element isolating region EI and the semiconductor substrate SB. The semiconductor region EIS is also provided in the main surface of the semiconductor substrate SB, the main surface being exposed from and adjacent to the element isolating region EI. That is, the semiconductor region EIS is provided within the semiconductor substrate SB so as to cover the sidewall and the bottom of the element isolating region EI.

When the correction of expanding the scale of the n⁻ semiconductor region N3 is performed as in the first modification, the n⁻ semiconductor region N3 becomes close to the element isolating region EI in the pixel PE2 in the end of the pixel array section as illustrated in FIG. 29. The semiconductor region EIS is a region into which a p impurity (for example, boron (B)) is introduced in the concentration of about $1 \times 10^{13}$ cm$^{-3}$, for example. The n⁻ semiconductor region N3 is a region into which an n impurity (for example, arsenic (As) or phosphorous (P)) is introduced in the concentration of about $1 \times 10^{12}$ cm$^{-3}$. Hence, when the n⁻ semiconductor region N3 becomes close to the element isolating region EI and thus overlaps with the semiconductor region EIS, such an overlapping region becomes the semiconductor region EIS as a p semiconductor region.

Hence, a portion of the n⁻ semiconductor region N3 overlapping with the semiconductor region EIS does not serve as part of the photodiode. That is, in the pixel PE2 illustrated in FIGS. 31 and 32, the semiconductor region EIS overlaps with the n⁻ semiconductor region N3 while the photodiode PD1 is in contact with the semiconductor region EIS.

In such a case, in the pixel PE2, the separation region SP is formed at a position such that width t1 in the X-axis direction of the photodiode PD1 exposed on the main surface of the semiconductor substrate SB between the semiconductor region EIS and the separation region SP is equal to width t2 in the X-axis direction of the photodiode PD2 exposed on the main surface of the semiconductor substrate SB between the separation region SP and the shading region SA.

The separation region SP in the pixel PE2 located close to the first end of the pixel array section is also disposed while being shifted toward the first end with respect to the middle between a second end distant from the separation region SP of the photodiode PD1 and a third end distant from the separation region SP of the photodiode PD2 in the X-axis direction. In the pixel PE2, therefore, the photodiode PD2 has area larger than area of the photodiode PD1 in plan view. The region, in which the semiconductor region EIS overlaps with the n⁻ semiconductor region N3, is not part of the photodiode PD1. The region, in which the shading region SA overlaps with the n⁻ semiconductor region N3, is part of the photodiode PD2 while not serving as a light receiving pixel.

In the structure shown in FIGS. 31 and 32, therefore, even if the n⁻ semiconductor region N3 overlaps with the semiconductor region EIS, area of the photodiode PD1 serving as a light receiving pixel can be adjusted to be roughly the same as area of the photodiode PD2 serving as a light receiving pixel in plan view in the pixel in the end of the image area. Consequently, it is possible to prevent an increase in difference in output between the two photodiodes PD1 and PD2 in the pixel, leading to improvement in accuracy and speed of image-plane phase-difference AF operation. Consequently, performance of the semiconductor unit can be improved.

The semiconductor region EIS can be formed whether the element isolating region EI is formed by the shallow trench isolation (STI) process or the local oxidization of silicon (LOCOS) process. When the semiconductor region EIS is used as the channel stopper, the semiconductor region EIS can be formed during a formation step of the element isolating region EI as described below.

When the element isolating region EI is formed by the STI process, during the formation step of the element isolating region EI, a trench is formed in the main surface of the semiconductor substrate SB exposed from a mask, and then the semiconductor region EIS is formed by implanting a p impurity into the surface of the semiconductor substrate SB exposed in the trench, and then the trench is filled with a silicon oxide film configuring the element isolating region EI. When the element isolating region EI is formed by the LOCOS process, during the formation step of the element isolating region EI, the semiconductor region EIS is formed by implanting a p impurity into the semiconductor substrate SB exposed from a mask, and then the element isolating region EI including a silicon oxide film is formed in a region exposed from the mask through oxidation treatment.

When the semiconductor region EIS is formed as the guard ring region, the semiconductor substrate is subjected to ion implantation at any time point after the formation step of the element isolating region EI (step S3 of FIG. 26) and before the formation step of the impurity region (step S8 of FIG. 26), thereby the semiconductor region EIS can be formed.

As described with FIGS. 31 and 32 hereinbefore, when some of the n⁻ semiconductor region N3 is invaded by the semiconductor region EIS used as the ion stopper region or the guard ring region, the formation position of the separation region SP is desirably determined in consideration of existence of the semiconductor region EIS in addition to the shading region SA.

Second Modification

Figure 33:
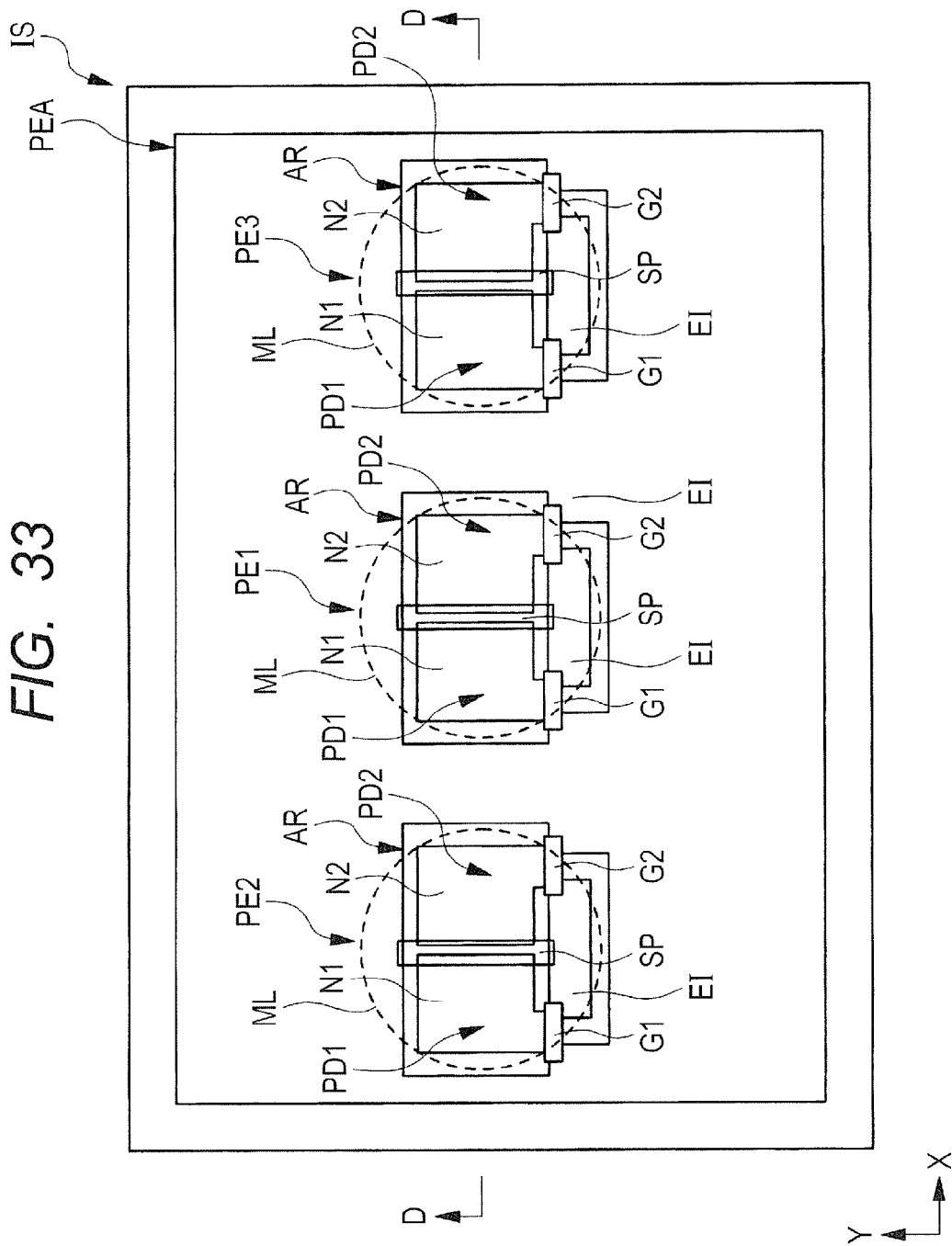
FIG. 33 is a plan view illustrating a semiconductor unit as a second modification of the third embodiment of the invention.
Figure 34:
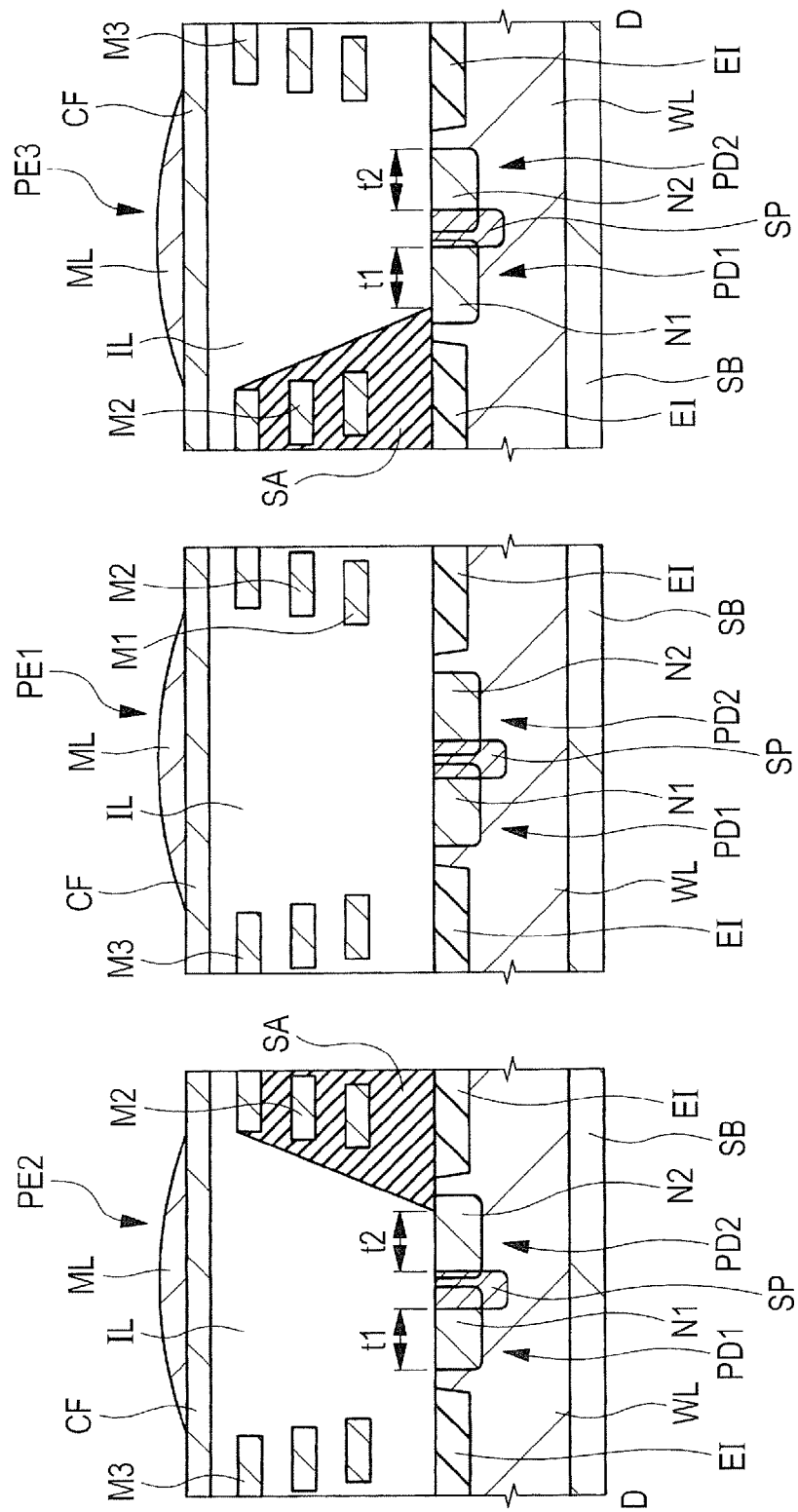
FIG. 34 is a section view along a line D-D in FIG. 33.

A second modification of the third embodiment is now described with FIGS. 33 and 34. FIG. 33 is a plan view of a solid-state imaging device as a semiconductor unit of the third embodiment. FIG. 34 is a section view along a line D-D in FIG. 33. As with FIGS. 24 and 25, FIGS. 33 and 34 each illustrate a pixel PE2 in one end in the longitudinal direction of the pixel allay section PEA, a pixel PE1 in the central portion of the pixel allay section PEA, and a pixel PE3 in the other end in the longitudinal direction of the pixel allay section PEA in order from the left of the drawing.

In the second modification, the structure of the solid-state imaging device is different from the structure described with FIGS. 24 and 25 in that two n⁻ semiconductor regions N1 and N2 are formed as with the solid-state imaging device described with FIGS. 2 to 21, but is the same as the structure described with FIGS. 24 and 25 in that the separation region SP with an expanded scale is formed to isolate the photodiodes PD1 and PD2 from each other, and in other structural points.

That is, in this modification, the scale of each of the n⁻ semiconductor regions N1 and N2 is not changed unlike the first modification. Hence, the n⁻ semiconductor regions N1 and the n⁻ semiconductor regions N2 in the pixel allay section PEA are provided while being arranged in rows and columns with the same first interval (arrangement period) as that for all the pixels in the pixel allay section PEA.

The solid-state imaging device of the second modification has a structure similar to the structure described with FIGS. 24 and 25 except that the n⁻ semiconductor regions N1 and N2 in each pixel are separately provided. Specifically, although each of the n⁻ semiconductor regions N1 and N2 is provided with the same width in the X-axis direction in any pixel, the separation region SP is provided at a position shifted toward the first end in the pixel PE2 in the first end of the pixel allay section PEA. In the pixel PE2, therefore, width in the X-axis direction across which the separation region SP overlaps with the n⁻ semiconductor region N1 is larger than width in the X-axis direction across which the separation region SP overlaps with the n⁻ semiconductor region N2. The separation region SP may not overlap with the n⁻ semiconductor region N2.

In other words, the center in the X-axis direction of the separation region SP is located closer to the first end than the center in the X-axis direction of a region including the photodiodes PD1 and PD2 in the pixel PE2.

Consequently, area of the photodiode PD1 provided in a region in which the separation region SP does not overlap with the n⁻ semiconductor region N1 is smaller than area of the photodiode PD2 provided in a region in which the separation region SP does not overlap with the n⁻ semiconductor region N2. However, as illustrated in FIG. 34, the separation region SP is disposed at a position such that the width t1 of the photodiode PD1, which does not overlap with the shading region SA and with the separation region SP, is equal to the width t2 of the photodiode PD2, which does not overlap with the shading region SA and with the separation region SP, in the X-axis direction in which the photodiodes PD1 and PD2 are arranged.

Consequently, effects similar to those of the structure described with FIGS. 24 and 25 can be provided. Furthermore, in the second modification, the separation region SP does not overlap with either the n– semiconductor region N1 or the n– semiconductor region N2 in a region between the n⁻ semiconductor regions N1 and N2. Hence, in the separation region SP formed with the same depth as that of each of the n⁻ semiconductor regions N1 and N2 between the n⁻ semiconductor regions N1 and N2, the number of the introduced n impurities is relatively large in either end in the X-axis direction, and the number of the introduced n impurities is small in the central portion in the X-axis direction compared with in either end.

That is, the region in which the separation region SP overlaps with the n⁻ semiconductor regions N1 and N2 can be adjusted to be smaller than the region in which the separation region SP overlaps with the n⁻ semiconductor region N3 in the structure described with FIGS. 24 and 25. It is therefore possible to prevent generation of dark electrons caused by overlap between the region containing the n impurity implanted therein and the region containing the p impurity implanted therein. Consequently, generation of dark current can be prevented in each pixel in the pixel allay section PEA.

Third Modification

Figure 35:
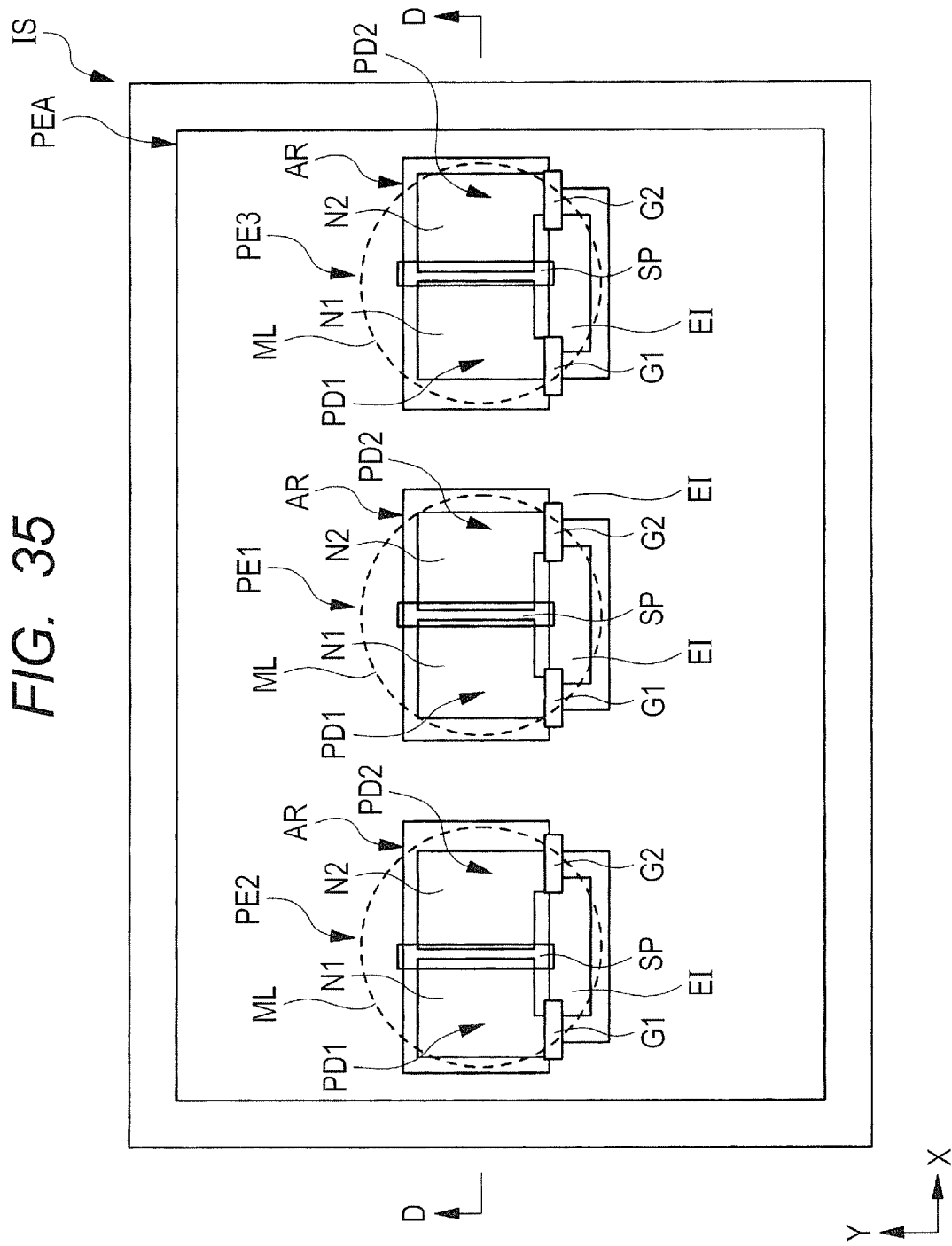
FIG. 35 is a plan view illustrating a semiconductor unit of a third modification of the third embodiment of the invention.
Figure 36:
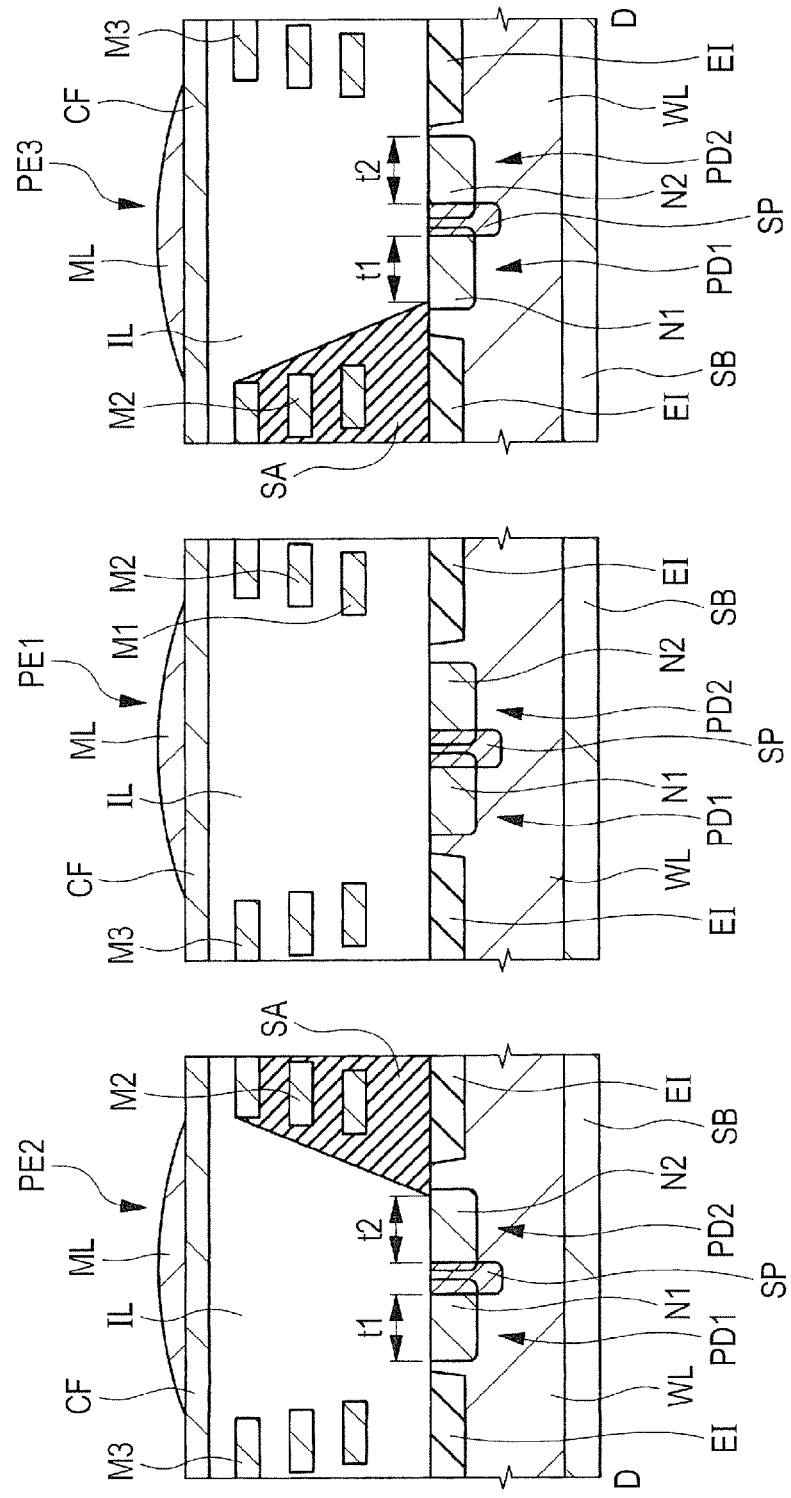
FIG. 36 is a section view along a line D-D in FIG. 35.

A third modification of the third embodiment is now described with FIGS. 35 and 36. FIG. 35 is a plan view of a solid-state imaging device as a semiconductor unit of the third embodiment. FIG. 36 is a section view along a line D-D in FIG. 35. As with FIGS. 24 and 25, FIGS. 35 and 36 each illustrate a pixel PE2 in one end in the longitudinal direction of the pixel allay section PEA, a pixel PE1 in the central portion of the pixel allay section PEA, and a pixel PE3 in the other end in the longitudinal direction of the pixel allay section PEA in order from the left of the drawing.

In the third modification, as in the second modification, two n⁻ semiconductor regions N1 and N2 are isolated from each other by the separation region SP formed with a corrected scale, so that the photodiodes PD1 and PD2 are provided. However, unlike the second modification, the n⁻ semiconductor regions N1 and N2 are also subjected to correction of expanding a layout over the entire pixel allay section PEA. In the pixel PE2 close to the end of the pixel allay section PEA illustrated in FIG. 35, therefore, the n⁻ semiconductor regions N1 and N2 are disposed while being shifted to a position close to that end compared with in the pixel PE1.

That is, a position of the n⁻ semiconductor regions N1 and N2 relative to the active region AR and the gate electrodes G1 and G2 in the pixel PE2 close to the end of the pixel allay section PEA is located in a region close to that end compared with a position of the n⁻ semiconductor regions N1 and N2 relative to the active region AR and the gate electrodes G1 and G2 in the pixel PE1.

In the third modification, the photodiodes PD1 and PD2 are provided while the separation region SP with a corrected scale is formed so as to overlap with some of the n⁻ semiconductor region N1 or N2, so that the photodiodes PD1 and PD2 are provided. The formation position of the separation region SP is controlled in this way, so that the width t1 of the photodiode PD1 that does not overlap with the shading region SA is equal to the width t2 of the photodiode PD2 that does not overlap with the shading region SA in the X-axis direction in which the photodiodes PD1 and PD2 are arranged. Consequently, effects similar to those in the first modification can be provided.

Furthermore, in the third modification, a region in which the separation region SP overlaps with the n-semiconductor regions N1 and N2 can be adjusted to be smaller than the region in which the separation region SP overlaps with the n− semiconductor region N3 (see FIGS. 29 and 30) in the first modification. It is therefore possible to prevent generation of dark electrons caused by overlap between the region containing the n impurity implanted therein and the region containing the p impurity implanted therein. Consequently, generation of dark current can be prevented in each pixel in the pixel allay section PEA.

As described with FIGS. 31 and 32, when some of the n− semiconductor region N1 or N2 is invaded by the semiconductor region EIS used as the ion stopper region or the guard ring region, the formation position of the separation region SP is desirably determined in consideration of existence of the semiconductor region EIS in addition to the shading region SA.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

For example, although boron (B) has been exemplified as an impurity ion to be ion-implanted to form a p semiconductor layer in a semiconductor substrate, $BF_2$ may also be implanted.

Although each of the above-described embodiments has been described with a case where each pixel has an active region surrounded by an element isolating region, for example, a plurality of pixels arranged in one line in the X-axis direction may share one active region extending like a belt in the X-axis direction in plan view. In such a case, a pixel isolating region as a p semiconductor region is probably provided between the pixels from a main surface of a semiconductor substrate to a bottom of a well region for inter-pixel isolation.

In addition, some of the contents of the embodiments is described below.

(1) A semiconductor unit including a solid-state imaging device including a plurality of pixels each including two photodiodes and a lens, the semiconductor unit including:
a semiconductor substrate;
a pixel array section extending in a first direction along a main surface of the semiconductor substrate on the main surface of the semiconductor substrate;
the pixels provided in the pixel array section;
the two photodiodes provided in the main surface of the semiconductor substrate in each of the pixels; and
gate electrodes that are provided on the semiconductor substrate and are adjacent to the two respective photodiodes in plan view,
wherein the two photodiodes are located close to the center of the pixel array section in the first direction with respect to the gate electrodes.

What is claimed is:

1. A semiconductor unit including a solid-state imaging device including pixels each including a first photodiode and a second photodiode, the semiconductor unit comprising:
a semiconductor substrate;
a pixel array section extending in a first direction along a main surface of the semiconductor substrate over the main surface of the semiconductor substrate;
the pixels provided in the pixel array section;
a first semiconductor region having a first conductivity type and a second semiconductor region having the first conductivity type arranged separately from each other in the first direction in the main surface of the semiconductor substrate in each of the pixels;
the first photodiode including the first semiconductor region;
the second photodiode including the second semiconductor region; and
a third semiconductor region having a second conductivity type different from the first conductivity type provided in the main surface of the semiconductor substrate and between the first photodiode and the second photodiode,
wherein a first pixel among the pixels is located near an end of the pixel array section in the first direction, and width of the first photodiode in the first pixel is smaller than width in the first direction of the second photodiode in the first pixel.

2. The semiconductor unit according to claim 1, wherein the center in the first direction of the third semiconductor region in the first pixel is located closer to the end than the center in the first direction of a region including the first photodiode and the second photodiode in the first pixel.

3. The semiconductor unit according to claim 1, wherein the first photodiode and the third semiconductor region in the first pixel are in contact with each other in plan view, and the second photodiode and the third semiconductor region in the first pixel are in contact with each other in plan view.

4. The semiconductor unit according to claim 1, further comprising an element isolating region surrounding the first photodiode and the second photodiode of each of the pixels in plan view,
wherein a shortest distance in the first direction between the first photodiode provided closer to the end than the second photodiode in the first pixel and the element isolating region is smaller than a shortest distance in the first direction between the first photodiode provided closer to the end than the second photodiode in a second pixel among the pixels, the second pixel being located in a central portion in the first direction of the pixel array section, and the element isolating region.

5. The semiconductor unit according to claim 4, further comprising:
a well region having the second conductivity type in contact with the first semiconductor region and the second semiconductor region so as to cover the first semiconductor region and the second semiconductor region in the semiconductor substrate; and
a fourth semiconductor region having the second conductivity type provided in a surface of the semiconductor substrate in contact with the element isolating region,
wherein impurity concentration of the fourth semiconductor region is higher than impurity concentration of the well region, and
wherein the first photodiode in the first pixel is in contact with the fourth semiconductor region in plan view.

* * * * *